United States Patent
Lee et al.

(10) Patent No.: US 7,326,608 B2
(45) Date of Patent: Feb. 5, 2008

(54) FIN FIELD EFFECT TRANSISTOR AND METHOD OF MANUFACTURING THE SAME

(75) Inventors: Deok-Hyung Lee, Seoul (KR);
Yu-Gyun Shin, Seongnam-si (KR);
Jong-Wook Lee, Yongin-si (KR);
Min-Gu Kang, Namyangju-si (KR)

(73) Assignee: Samsung Electronic Co., Ltd. (KR)

( * ) Notice: Subject to any disclaimer, the term of this patent is extended or adjusted under 35 U.S.C. 154(b) by 176 days.

(21) Appl. No.: 11/292,261

(22) Filed: Nov. 30, 2005

(65) Prior Publication Data

US 2006/0118876 A1 Jun. 8, 2006

(30) Foreign Application Priority Data

Dec. 3, 2004 (KR) ...................... 10-2004-0100747

(51) Int. Cl.
*H01L 21/8238* (2006.01)
(52) U.S. Cl. ...................... 438/218; 438/196; 438/197; 438/294; 257/E21.014
(58) Field of Classification Search ................ 438/196, 438/218; 257/E21.014, E21.4, E21.615, 257/E21.37, E21.377, E21.409
See application file for complete search history.

(56) References Cited

U.S. PATENT DOCUMENTS

| | | | |
|---|---|---|---|
| 4,979,014 A | 12/1990 | Hieda et al. .................. | 357/56 |
| 6,642,090 B1 | 11/2003 | Fried et al. .................. | 438/164 |
| 6,998,676 B2 | 2/2006 | Kondo et al. ................ | 257/329 |
| 2005/0145932 A1* | 7/2005 | Park et al. ................... | 257/328 |
| 2005/0215040 A1* | 9/2005 | Doyle .......................... | 438/585 |
| 2005/0255643 A1* | 11/2005 | Ahn et al. ................... | 438/197 |

FOREIGN PATENT DOCUMENTS

| | | |
|---|---|---|
| JP | 2002-118255 | 4/2002 |
| JP | 2004-214413 | 7/2004 |
| KR | 10-2003-0065631 | 8/2003 |

* cited by examiner

*Primary Examiner*—Michael Lebentritt
*Assistant Examiner*—Cheung Lee
(74) *Attorney, Agent, or Firm*—Mills & Onello LLP

(57) ABSTRACT

In a fin field effect transistor (FET), an active pattern protrudes in a vertical direction from a substrate and extends across the substrate in a first horizontal direction. A first silicon nitride pattern is formed on the active pattern, and a first oxide pattern and a second silicon nitride pattern are sequentially formed on the substrate and on a sidewall of a lower portion of the active pattern. A device isolation layer is formed on the second silicon nitride pattern, and a top surface of the device isolation layer is coplanar with top surfaces of the oxide pattern and the second silicon nitride pattern. A buffer pattern having an etching selectivity with respect to the second silicon nitride pattern is formed between the first oxide pattern and the second silicon nitride pattern. Internal stresses that can be generated in sidewalls of the active pattern are sufficiently released and an original shape of the first silicon nitride pattern remains unchanged, thereby improving electrical characteristics of the fin FET.

13 Claims, 17 Drawing Sheets

FIRST DIRECTION

SECOND DIRECTION

FIN FIELD EFFECT TRANSISTOR AND METHOD OF MANUFACTURING THE SAME

CROSS-REFERENCES TO RELATED APPLICATIONS

This application relies for priority upon Korean Patent Application No. 2004-100747 filed on Dec. 3, 2004, the content of which is herein incorporated by reference in its entirety.

BACKGROUND OF THE INVENTION

1. Field of the Invention

The present invention relates to a fin field effect transistor (FET) and a method of manufacturing the same, and more particularly, relates to a double gate fin FET and a method of manufacturing the same.

2. Description of the Related Art

Complementary metal oxide silicon (CMOS) devices are widely used in various logic circuit applications such as central processing units and memory devices, and a great deal of added value can be generated in a CMOS-related industry. Accordingly, there has been intensive worldwide research has been conducted on CMOS devices based on nanotechnology. In many semiconductor device applications, the semiconductor device is required to exhibit low power consumption, small size and/or high operation speeds. CMOS devices are often capable of meeting all of these requirements.

However, as the size of CMOS devices continue to become reduced to very small levels, an effect known as a short channel effect can result as a consequence of the scaling-down of the gate size of the device. This short-channel effect can degrade the performance of the CMOS device.

Conventional CMOS devices are typically fabricated on bulk silicon substrates. However, in such conventional CMOS devices, the characteristics of the device may be strongly influenced by the processing conditions used in fabricating the device when the gate length of the device is scaled down to less than about 50 nm, and conventional CMOS devices may break down completely and cease to operate as semiconductor circuits when the gate length of the device is scaled down to less than about 30 nm.

In addition, although the gate length of the device is scaled down, the occupying area for a unit cell is not scaled down because a spacer on a sidewall of a gate electrode is not reduced, so that the size reduction of the gate length does not necessarily contribute to increase in the degree of integration of a semiconductor device.

The use of silicon-on-insulator (SOI) semiconductor devices (SOI devices) has been suggested as a way to provide CMOS devices with channel lengths of about 30 nm or less without the above technical limits of associated with bulk-silicon-based CMOS devices. However, fabrication of conventional CMOS devices on SOI substrates may result in an increase in the parasitic resistance at the source/drain regions because the silicon layer of the SOI substrate is very thin, and thus a selective epitaxial growth step to form elevated source/drain regions may be included when fabricating transistors in SOI devices. In addition, SOI devices may exhibit relatively poor contact with the substrate such that a floating body effect may arise and/or heat conduction between the device and the substrate may be reduced. All of these effects may operate to reduce device performance.

As described above, the SOI devices also do not necessarily contribute to reduction of a device size as compared with conventional bulk-silicon-based CMOS devices, so that the use of triple or double gate structures has been suggested as a way for efficiently reducing the channel length of CMOS devices to less than about 25 nm. Such CMOS devices are known as fin field effect transistors (fin FET).

When the channel is formed, both side and top surfaces of a fin, which is a pattern protruded from the bulk silicon substrate, a gate electrode is formed on each of the three surfaces of the fin, and a FET including three gate electrodes is known as a triple gate FET. In contrast, when a capping layer is formed on the top surface of the fin and a vertical gate field is interrupted by the capping layer, a gate electrode is formed on both side surfaces of the fin and a FET including two gate electrodes is known as a double gate FET.

Accordingly, since a gate electrode is formed on each surface of the channel region, fin FET transistors may provide improved gate control characteristics, which may result in reduced current leakage between source and drain electrodes of a transistor when compared with a conventional, single gate CMOS device, thereby improving a drain-induced barrier lowering (DIBL) phenomenon.

In addition, a threshold voltage of the fin FET may be varied dynamically because of the double gate; thus, a switching characteristic of a channel in the transistor may be considerably improved as compared with the conventional single gate. Therefore, a driving current of the transistor is increased and the short channel effect is sufficiently prevented.

However, the fin FET and the manufacturing method thereof have various associated problems. Such limitations will be described with reference to FIGS. 1-6. FIG. 1 is a perspective view illustrating a conventional triple gate fin FET, and FIG. 2 is a perspective view illustrating a conventional double gate fin FET. FIG. 3 is a perspective view illustrating a damaged capping layer of the double gate fin FET shown in FIG. 2.

Referring to FIG. 1, a width of a fin 20 in a triple gate fin FET 10 is reduced due to a recent trend of high integration in semiconductor devices; thus, an end portion A of the fin 10 becomes acute as various processes are repeated. Accordingly, an electric field that is applied in a vertical direction with respect to the fin 10 (hereinafter referred to as a vertical gate field), is focused into the end portion A of the fin 10. As a result, electric characteristics of the transistor are deteriorated due to the concentration of the vertical gate field, such as swing degradation below a threshold voltage, decrease of threshold voltage and increase of current leakage below the threshold voltage. Furthermore, the fin 20 is also etched away during an etching process against a gate conductive layer 30a for forming a gate electrode 30, so that a source/drain region 20a of the fin 20 is formed to be lower than a channel region 20b by as much as a distance B.

For the above reasons, the double gate fin FET 150 has been suggested as shown in FIG. 2. A capping layer 120 is formed on the fin 110 in the double gate fin FET 150. The capping layer 120 on the fin 110 controls the vertical gate field and maintains an original shape of the fin 110. Further, the capping layer 120 prevents a source/drain region of the fin 110 from being etched away when the fin 110 is under an etching process for forming a gate electrode 130.

However, the capping layer 120 is also unfavorably etched away during subsequent processes for forming a channel region, so that the original shape of the capping layer 120 is damaged and changed as shown in FIG. 3, or although not shown in FIG. 3, is completely removed from the fin 100. The damaged capping layer 120a also causes the same problem as known in the three gate fin FET.

Hereinafter, the reason for which the original shape of the capping layer is changed is described with reference to FIGS. 4 to 6.

FIGS. 4 to 6 are perspective views illustrating processing steps for a method of forming a conventional double gate fin FET.

Referring to FIG. 4, a silicon nitride layer is formed on a silicon substrate by a chemical vapor deposition (CVD) process. Then, the silicon nitride layer is patterned to thereby form a capping layer 120. The substrate is partially etched away using the capping layer 120 as an etching mask. Hereinafter, the etched substrate is designated as a reference numeral 100a in FIG. 4. The etching of the substrate forms a fin 110 protruded from the etched substrate 100a and extended along a first direction. A sidewall oxide layer 112 is formed on sidewalls of the fin 110 by a thermal oxidation process, so that damages on the sidewalls of the fin 110 are sufficiently cured. Then, a silicon nitride layer 114 is formed on the sidewall oxide layer 112 and the capping layer 120 by a CVD process as a liner; so that an oxidation of the sidewall of the fin 110 is prevented. A device isolation layer 116 for isolating conductive structures from each other is formed on the silicon nitride layer 114 to a predetermined thickness.

Referring to FIG. 5, the silicon nitride layer 114 above a top surface of the device isolation layer 116 is etched away using a phosphoric acid (H3PO4) solution as an etchant, thereby forming a silicon nitride pattern 114a of which a top surface is coplanar with the top surface of the device isolation layer 116.

When the silicon nitride layer 114 is etched away, the capping layer 120 is also etched away by the phosphoric acid (H3PO4) solution since the capping layer 120 is also comprised of silicon nitride. An optimization of the etching conditions may minimize an etching amount of the capping layer 120. However, the capping layer 120 is inevitably etched away by a certain amount despite the optimization of the etching conditions. Accordingly, the capping layer is somewhat damaged and an original shape of the capping layer is somewhat changed as shown by the damaged capping layer 120a shown in FIGS. 3 and 5. Moreover, when the capping layer 120 is over-etched away, the capping layer is completely removed from the fin 110.

Then, the sidewall oxide layer 112 above the top surface of the device isolation layer 116 is etched away using an aqueous hydrogen fluoride (HF) solution as an etchant, thereby forming a sidewall oxide pattern 112a of which a top surface is also coplanar with the top surface of the device isolation layer 116. As a result, a top portion 110a of the fin 110 is exposed by the sequential etching processes against the silicon nitride layer 114 and the sidewall oxide layer 112.

Referring to FIG. 6, a gate electrode 130 is formed on the device isolation layer 116 in the second direction perpendicular to the first direction, so that the exposed top portion 110a of the fin 110 is partially covered with the gate electrode 130. A dry etching process is performed during the etching process for forming the gate electrode 130, and the damaged capping layer 120a is further damaged and the shape thereof is further changed. In FIG. 6, reference numeral 120b designates a capping layer consecutively damaged by the above etching processes.

As a result, most of the capping layer 120 is damaged and an original shape thereof is changed by various etching processes, and moreover, may be completely removed from the fin 110 after the etching process.

A vertical channel fin FET has been suggested for solving the above problems as disclosed in U.S. Patent Publication No. 2005-145932. According to the above U.S. patent publication, a buffer oxide layer is formed on a nitride layer, which operates as an etch stop layer formed on the fin of the vertical channel fin FET, by a CVD process for preventing the nitride layer from being etched away in a subsequent process. As a result, the nitride layer for the etching stop layer is prevented from being etched away when a nitride layer for a liner is formed in a subsequent process.

However, the above vertical channel fin FET has a problem in that sidewall defects of the fin caused by an etching process for the fin are hardly cured because the buffer oxide layer is formed by a CVD process. The above non-cured sidewall defects of the fin may increase a charge trap on a gate insulation layer and deteriorate the quality of the gate insulation layer, thereby generating current leakage from the channel region. Moreover, when the defects are formed in the channel region, carrier mobility in the channel region is remarkably reduced, thereby decreasing an operation current of the fin FET.

SUMMARY OF THE INVENTION

Accordingly, the present invention provides a fin FET having a capping layer of which an original shape is maintained and having sidewall defects of a fin thereof that are mitigated or eliminated.

The present invention also provides a method of manufacturing the above-mentioned fin FET.

According to an aspect of the present invention, there is provided a fin field effect transistor that avoids the occurrence of damage at sidewalls of the fin. An active pattern protrudes in a vertical direction from a substrate and extends in a first horizontal direction along the substrate. A first silicon nitride pattern is provided on the active pattern. A first oxide pattern is provided on a surface of the substrate and on a sidewall of a lower portion of the active pattern, and a second silicon nitride pattern is provided on the oxide pattern. A device isolation layer is provided on the second silicon nitride pattern, so that a top surface of the device isolation layer is substantially coplanar with top surfaces of the oxide pattern and the second silicon nitride pattern. A buffer pattern is provided between the first oxide pattern and the second silicon nitride pattern, and the buffer pattern has an etching selectivity with respect to the second silicon nitride pattern.

In one embodiment, the buffer pattern is comprised of silicon oxide.

In another embodiment, the buffer pattern has a thickness of about 20 Å to about 100 Å.

In another embodiment, the second silicon nitride layer has a thickness of about 50 Å to about 200 Å.

In another embodiment, the device isolation layer includes one of a high density plasma (HDP) oxide layer formed by a high density plasma chemical vapor deposition (HDP-CVD) process, a spin on glass (SOG) layer and a CVD oxide layer formed by a CVD process.

In another embodiment, the fin field effect transistor further comprises a second oxide pattern between the active pattern and the first silicon nitride pattern.

In another embodiment, the second oxide pattern has a thickness of about 10 Å to about 100 Å.

According to another aspect of the present invention, there is provided a fin field effect transistor. An active pattern protrudes from a substrate in a vertical direction and extends along the substrate in a first direction. A first silicon nitride pattern is provided on the active pattern. A first oxide pattern is provided on a surface of the substrate and on a sidewall of a lower portion of the active pattern, and a second silicon nitride pattern provided on the oxide pattern. A device isolation layer is provided on the second silicon nitride pattern, so that a top surface of the device isolation layer is substantially coplanar with top surfaces of the oxide pattern and the second silicon nitride pattern. A gate electrode is provided on the device isolation layer extending in a second horizontal direction perpendicular to the first horizontal direction and having a width in the first horizontal direction, so that an upper portion of the active pattern and the first silicon nitride pattern are partially covered with the gate electrode. A source/drain region is provided on the active pattern adjacent to the gate electrode. A buffer pattern is provided between the first oxide pattern and the second silicon nitride pattern, and the buffer pattern has an etching selectivity with respect to the second silicon nitride pattern.

In one embodiment, the buffer pattern is comprised of silicon oxide.

In another embodiment, the buffer pattern has a thickness of about 20 Å to about 100 Å.

In another embodiment, the second silicon nitride layer has a thickness of about 50 Å to about 200 Å.

In another embodiment, the device isolation layer includes one of a high density plasma (HDP) oxide layer formed by a high density plasma chemical vapor deposition (HDP-CVD) process, a spin on glass (SOG) layer and a CVD oxide layer formed by a CVD process.

In another embodiment, the fin field effect transistor further comprises a second oxide pattern between the active pattern and the first silicon nitride pattern.

In another embodiment, the second oxide pattern has a thickness of about 10 Å to about 100 Å.

According to still another aspect of the present invention, there is provided a method of forming a fin field effect transistor. A first silicon nitride pattern is formed on a substrate, and an active pattern is formed by etching the substrate using the first silicon nitride pattern as an etching mask, so that the active pattern protrudes from the substrate in a vertical direction and extends across the substrate in a horizontal direction. A first oxide pattern is formed on a surface of the substrate and on sidewalls and on a top surface of the active pattern. A buffer layer is formed on the first oxide layer, and a second silicon nitride layer is formed on the buffer layer. The second silicon nitride layer has a higher etching rate than the buffer layer. A device isolation layer is formed on the second silicon nitride layer at both side portions of the active pattern, so that a top surface of the device isolation layer is lower than a top portion of the active pattern and so that the second silicon nitride layer is partially exposed. The exposed second silicon nitride layer is formed by a first etching process, so that the buffer oxide layer is partially exposed and a second silicon nitride pattern is formed. The exposed buffer layer and the first oxide layer under the exposed buffer layer are removed by a second etching process, thereby forming a buffer pattern and a first oxide pattern.

In one embodiment, the buffer layer is formed by depositing silicon oxide onto the first oxide layer by a CVD process.

In another embodiment, the first oxide layer is formed by one of a rapid thermal oxidation process, a furnace thermal oxidation process and a plasma oxidation process.

In another embodiment, the first etching process includes a wet etching process using a phosphoric acid (H3PO4) solution as an etchant.

In another embodiment, the second etching process includes a wet etching process using a hydrogen fluoride (HF) solution as an etchant.

In another embodiment, the method further comprises forming a second oxide pattern on the substrate before forming the first silicon nitride pattern on a substrate.

In another embodiment, forming the device isolation layer includes: forming an isolation layer on the second silicon nitride layer to a thickness to cover the active pattern and the first silicon nitride pattern; partially removing the isolation layer until a top surface of the first silicon nitride pattern is exposed, thereby forming an isolation pattern on the second silicon nitride layer; partially etching the isolation pattern, so that the second silicon nitride layer formed on an upper portion of the active pattern is exposed.

According to further still another aspect of the present invention, there is provided a method of forming a fin field effect transistor. A first silicon nitride pattern is formed on a substrate, and an active pattern is formed by etching the substrate using the first silicon nitride pattern as an etching mask, so that the active pattern extends in a first horizontal direction along the substrate. A first oxide pattern is formed on a surface of the substrate and on sidewalls and on a top surface of the active pattern. A buffer layer is formed on the first oxide layer, and a second silicon nitride layer is formed on the buffer layer. The second silicon nitride layer has a higher etching rate than the buffer layer. A device isolation layer is formed on the second silicon nitride layer at both side portions of the active pattern, so that a top surface of the device isolation layer is lower than a top portion of the active pattern and so that the second silicon nitride layer is partially exposed. The exposed second silicon nitride layer is removed by a first etching process, so that the buffer oxide layer is partially exposed and a second silicon nitride pattern is formed. The exposed buffer layer and the first oxide layer under the exposed buffer layer are removed by a second etching process, thereby forming a buffer pattern and a first oxide pattern. A gate electrode is formed on the device isolation layer extending in a second horizontal direction perpendicular to the first horizontal direction, and having a width in the first horizontal direction, so that the active pattern and the first silicon nitride pattern are partially covered with the gate electrode. A source/drain region is formed on the active pattern adjacent to the gate electrode.

In one embodiment, the first oxide layer is formed by one of a rapid thermal oxidation process, a furnace thermal oxidation process and a plasma oxidation process.

In another embodiment, the first etching process includes a wet etching process using a phosphoric acid (H3PO4) solution as an etchant.

In another embodiment, the second etching process includes a wet etching process using a hydrogen fluoride (HF) solution as an etchant.

In another embodiment, forming the device isolation layer includes: forming an isolation layer on the second silicon nitride layer to a thickness to cover the active pattern and the first silicon nitride pattern; partially removing the isolation layer until a top surface of the first silicon nitride pattern is exposed, thereby forming an isolation pattern on the second silicon nitride layer; partially etching the isolation pattern, so that the second silicon nitride layer formed on an upper portion of the active pattern is exposed.

According to the present invention, internal stresses that otherwise can be applied to sidewalls of the active pattern are sufficiently alleviated and an original shape of the first silicon nitride pattern, which is a capping layer of the active pattern, is maintained in an unchanged state throughout fabrication, so that concentration of the vertical gate field is sufficiently prevented and so that electrical characteristics of the fin FET are improved.

BRIEF DESCRIPTION OF THE DRAWINGS

The above and other features and advantages of the present invention will become readily apparent by reference to the following detailed description when considering in conjunction with the accompanying drawings, in which.

DETAILED DESCRIPTION. OF EMBODIMENTS OF THE INVENTION

Figure 1:
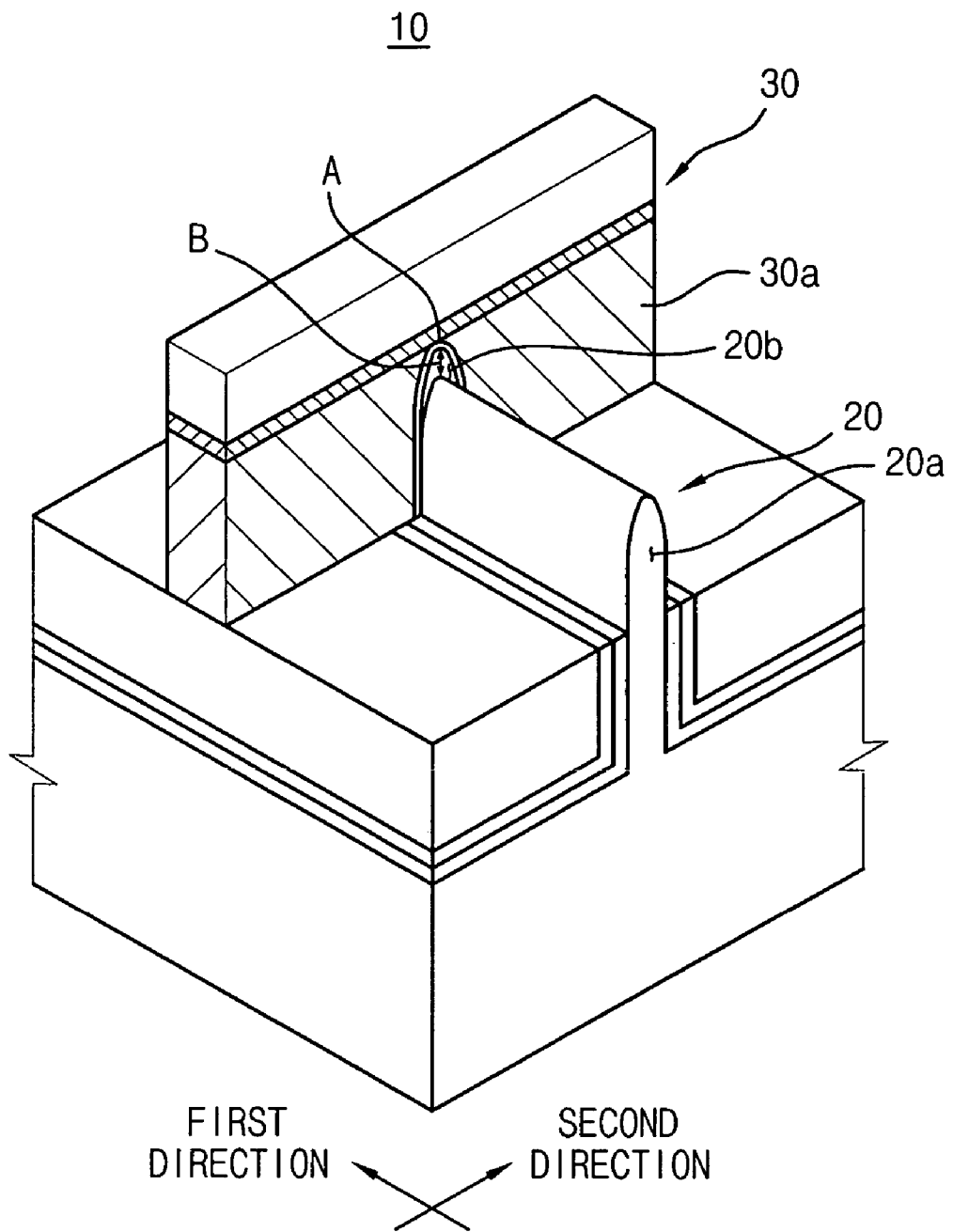
FIG. 1 is a perspective view illustrating a conventional triple gate fin FET.
Figure 2:
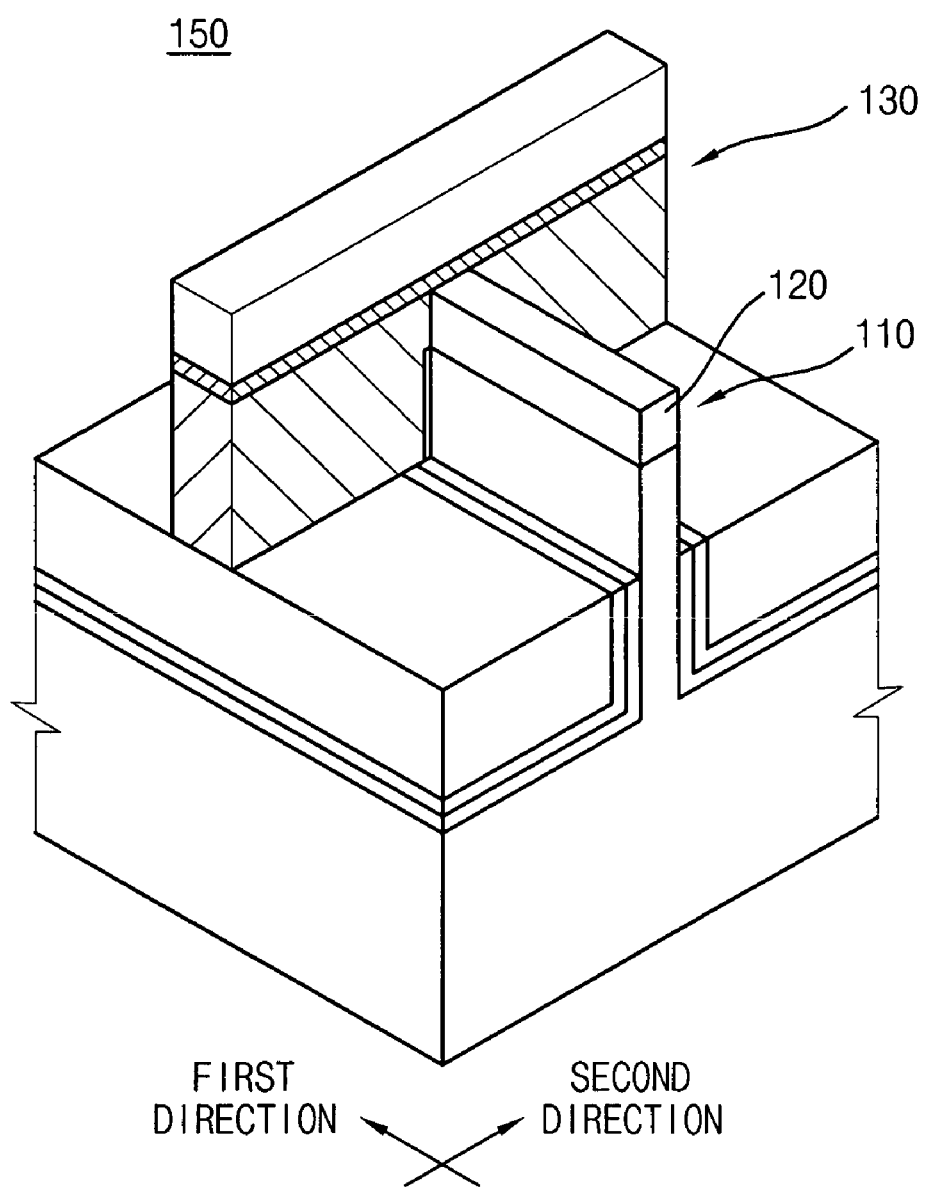
FIG. 2 is a perspective view illustrating a conventional double gate fin FET.
Figure 3:
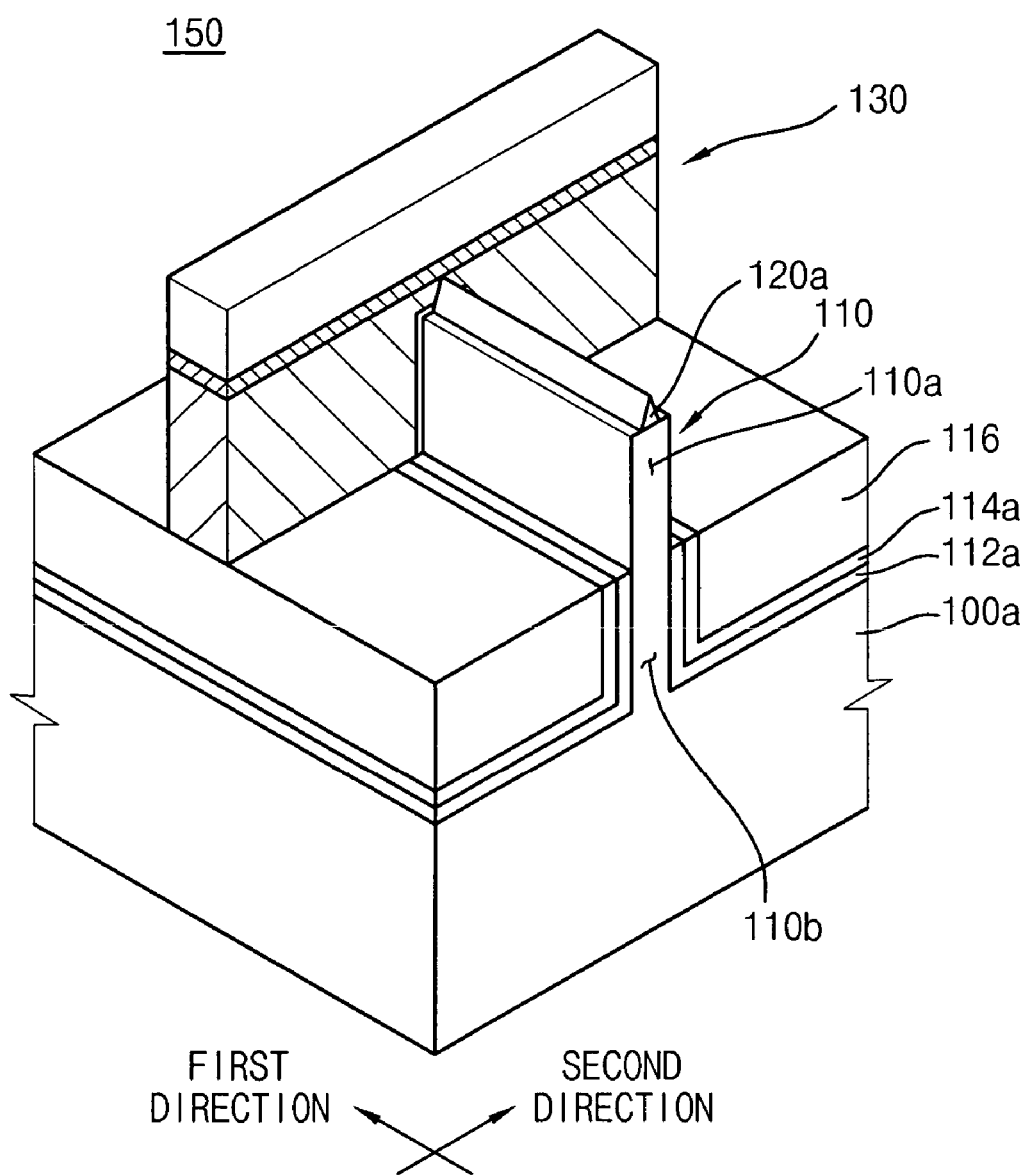
FIG. 3 is a perspective view illustrating a damaged capping layer of the double gate fin FET shown in FIG. 2.
Figure 4:
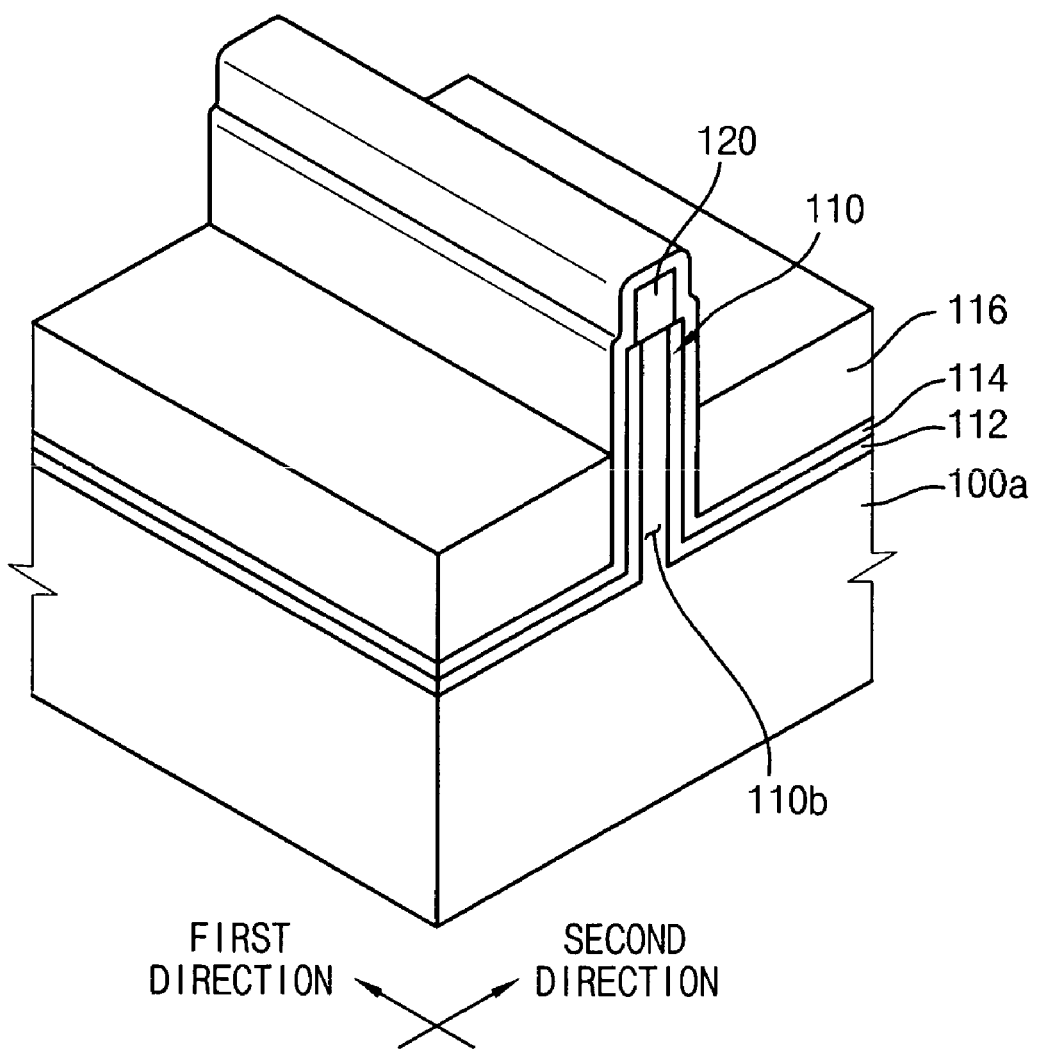
FIGS. 4 to 6 are perspective views illustrating processing steps for a method of forming a conventional double gate fin FET.
Figure 5:
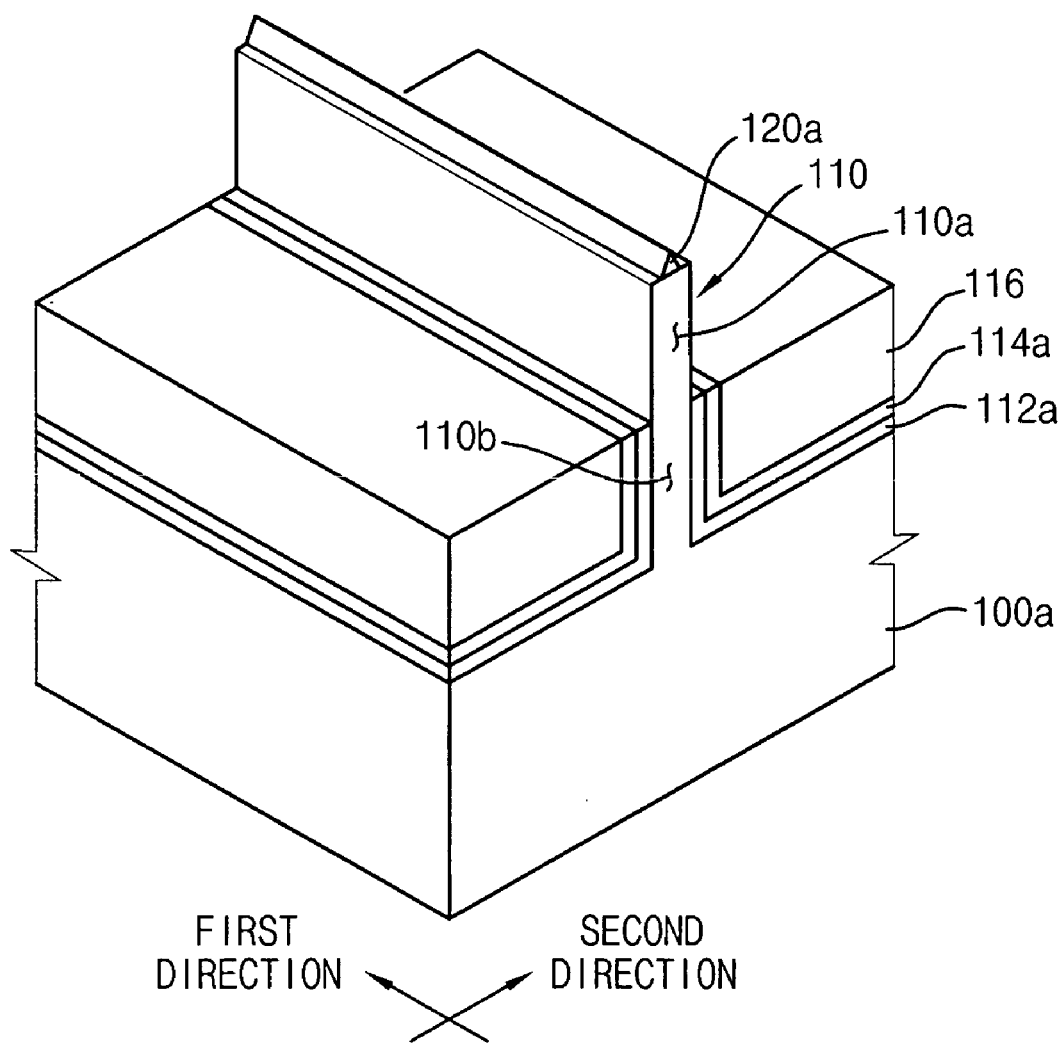
Figure 6:
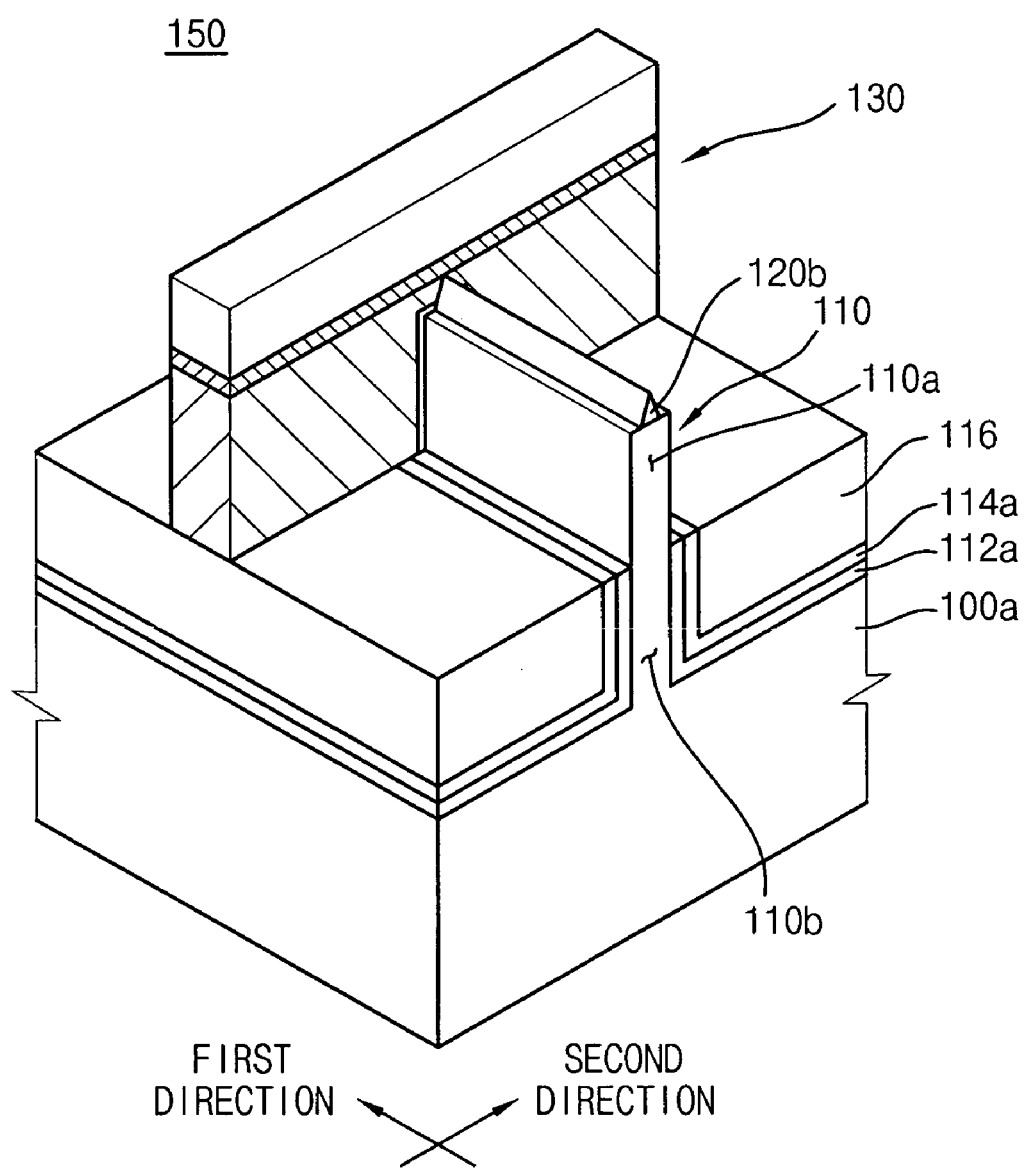

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs.

Figure 7:
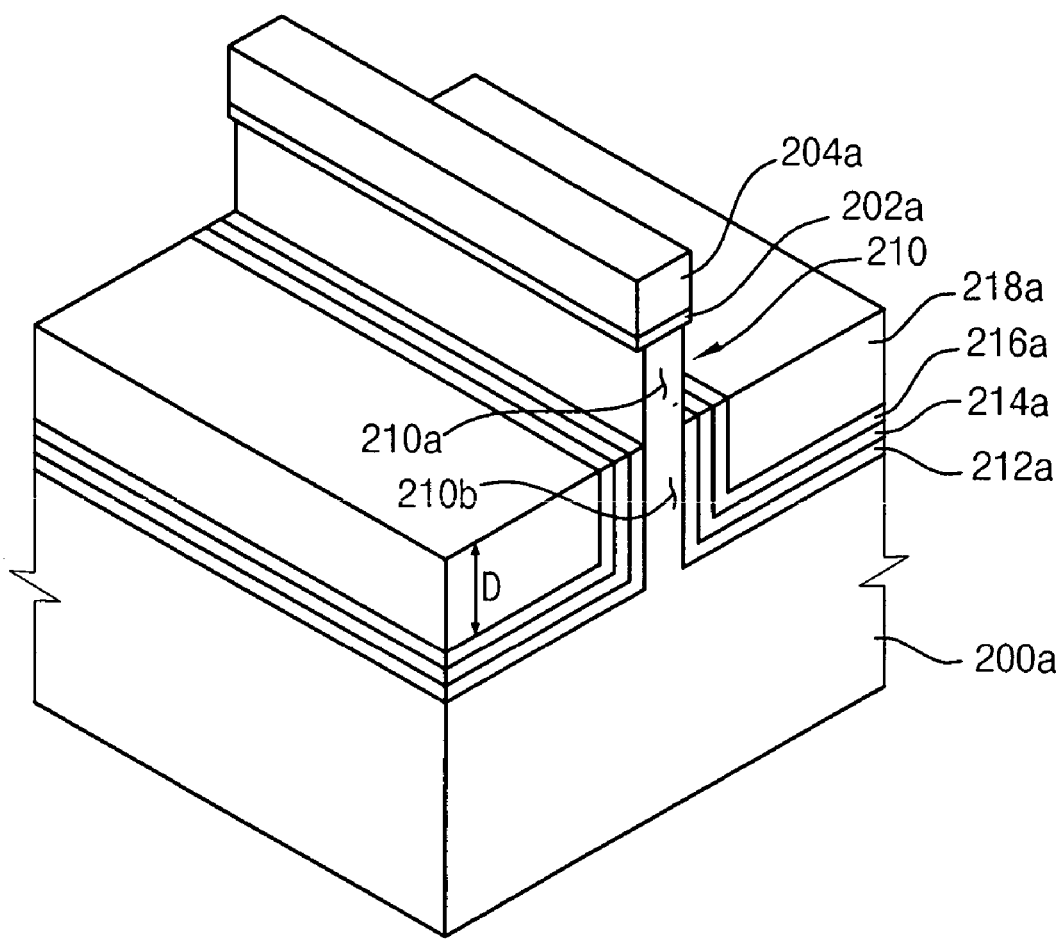
FIG. 7 is a perspective view illustrating a fin FET according to a first embodiment of the present invention.

FIG. 7 is a perspective view illustrating a fin FET according to a first embodiment of the present invention.

Referring to FIG. 7, the fin FET 300 of the first embodiment of the present invention includes a substrate 200a such as a silicon wafer, an active pattern 210, a first silicon nitride pattern 204a, a second oxide pattern 212a, a buffer pattern 214a, a second silicon nitride pattern 216a and a device isolation layer 218a. The fin FET 300 may further include a first oxide pattern 202a formed between the active pattern 210 and the first silicon nitride pattern 204a. When the first oxide pattern 202a is formed to a thickness below about 10 Å, a process for forming the first oxide pattern 202a is difficult to perform due to a small thickness thereof. When the first oxide pattern 202a is formed to a thickness over about 100 Å, notches on sidewalls of the first oxide pattern are so large that operation failures due to the notch are frequently generated. Accordingly, the first oxide pattern 202a is formed to a thickness of about 10 Å to about 100 Å.

The active pattern 210, which is known as a fin, is protruded from a surface of the substrate 200a in a predetermined direction and is extended across the substrate 200a. The active pattern 210 includes a first portion 210a not covered by the second oxide pattern 212a, to be thereby exposed, and a second portion 210b covered by the second oxide pattern 212a. A channel region (not shown) and a source/drain region (hot shown) are formed on the first portion 210a of the active pattern 210 in a subsequent process. A height of the first portion 210a is determined in accordance with the desired length of the channel region.

The first silicon nitride pattern 204a is formed on the active pattern 210. The first silicon nitride pattern 204a operates as an etching mask pattern during an etching process for forming the active pattern 210. Further, the first silicon nitride pattern 204a also operates as a capping layer for preventing a vertical gate field from becoming concentrated at a spired portion of the active pattern 210 and for preventing the active pattern 210 from being etched away in a subsequent process.

The second oxide pattern 212a is continuously formed on the surface of the substrate 200a and on sidewalls of a lower portion of the active pattern 210. In the present embodiment, the second oxide pattern 212a is continuously formed on the surface of the substrate 200a and on sidewalls of the second portion 210b of the active pattern 210. The second oxide pattern 212a operates to release internal stresses that can be generated in sidewalls of the active pattern 210 when a dry etching process for forming the active pattern is performed.

A buffer pattern 214a is formed on the second oxide pattern 212a and prevents the first silicon nitride pattern 204a from being damaged in repeated etching processes. The buffer pattern 214a is comprised of a material having etching selectivity with respect to the second silicon nitride pattern 216a, and in particular, is comprised of silicon oxide in the present embodiment. When the buffer pattern 214a is formed to a thickness below about 20 Å, the first silicon nitride layer 204a is not sufficiently prevented from being damaged in the etching process. When the buffer pattern 214a is formed to a thickness over about 100 Å, electrical characteristics of the fin FET are deteriorated due to an excessive thickness. Accordingly, the buffer pattern 214a is formed to a thickness of about 20 Å to about 100 Å.

The second silicon nitride pattern 216a is formed on a surface of the buffer pattern 214a, and operates as a liner for preventing oxidation of the active pattern 210. When the second silicon nitride pattern 216a is formed to a thickness below about 50 Å, the active pattern 210 is not sufficiently prevented from being oxidized by the second silicon nitride pattern 216a. When the second silicon nitride pattern 216a is formed to a thickness over about 200 Å, electrical characteristics of the fin FET are deteriorated due to an excessive thickness. Accordingly, the second silicon nitride pattern 216a is formed to a thickness of about 50 Å to about 200 Å.

The device isolation layer 218a is formed on a surface of the second silicon nitride pattern 216a and on sidewalls of a lower portion of the active pattern 210 at both side portions of the active pattern 210, so that a top surface of the device isolation layer 218a is lower than a top portion of the active pattern 210. In the present embodiment, the device isolation layer 218a is formed on the surface of the second silicon nitride pattern 216a to such a depth D that the top surface of the device isolation layer 218a is coplanar with a top surface of the second silicon nitride pattern 216a. That is, the device isolation layer 218a is surrounded by the second silicon nitride pattern 216a with the depth D corresponding to a height of the second portion 210b of the active pattern 210. The depth D of the device isolation layer 218a is determined in accordance with a length of a channel region of the fin FET. The device isolation layer 218a includes one of an oxide layer formed by a high density plasma CVD (HDP-CVD) process, a spin-on-glass (SOG) layer and an oxide layer formed by a CVD process. In the present embodiment, the device isolation layer includes an oxide layer formed by a high density plasma CVD (HDP-CVD) process.

According to the above fin FET 300, damaged sidewalls of the active pattern 210 are sufficiently cured and an original shape of the first silicon nitride pattern 204a is unchanged, thereby improving electrical characteristics of the fin FET 300.

FIGS. 8 to 18 are perspective views illustrating processing steps for a method of manufacturing the fin FET shown in FIG. 7.

Figure 8:
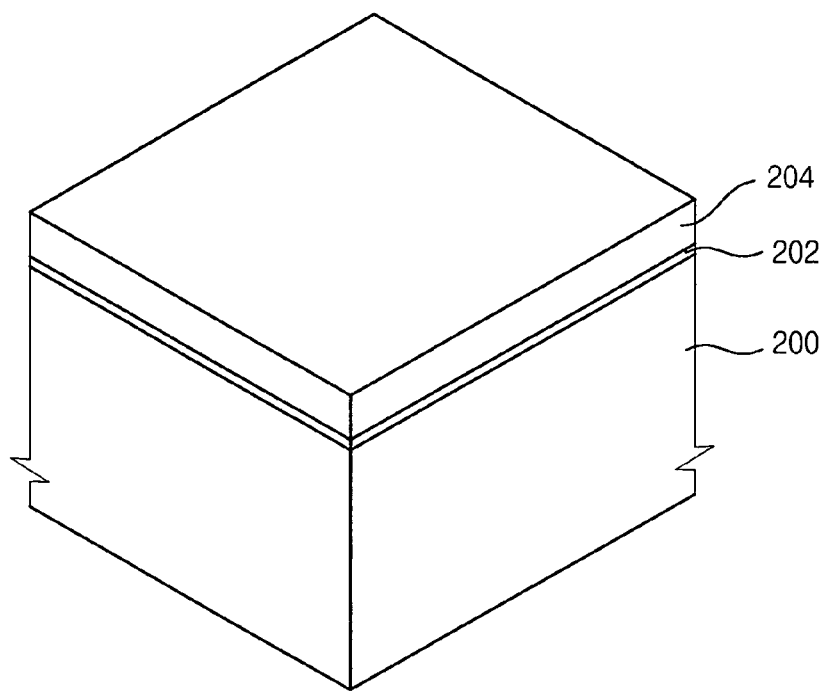
FIGS. 8 to 18 are perspective views illustrating processing steps for a method of manufacturing the fin FET shown in FIG. 7.

Referring to FIG. 8, a first oxide layer 202 is formed on a surface of a substrate 200 such as a silicon wafer by a rapid thermal oxidation process, a furnace thermal oxidation process or a plasma oxidation process. In the present embodiment, the first oxide layer 202 is formed to a thickness of about 10 Å to about 100 Å.

A first silicon nitride layer 204 is formed on the first oxide layer 202 as a hard mask layer and a capping layer by a low pressure CVD (LPCVD) process.

Figure 9:
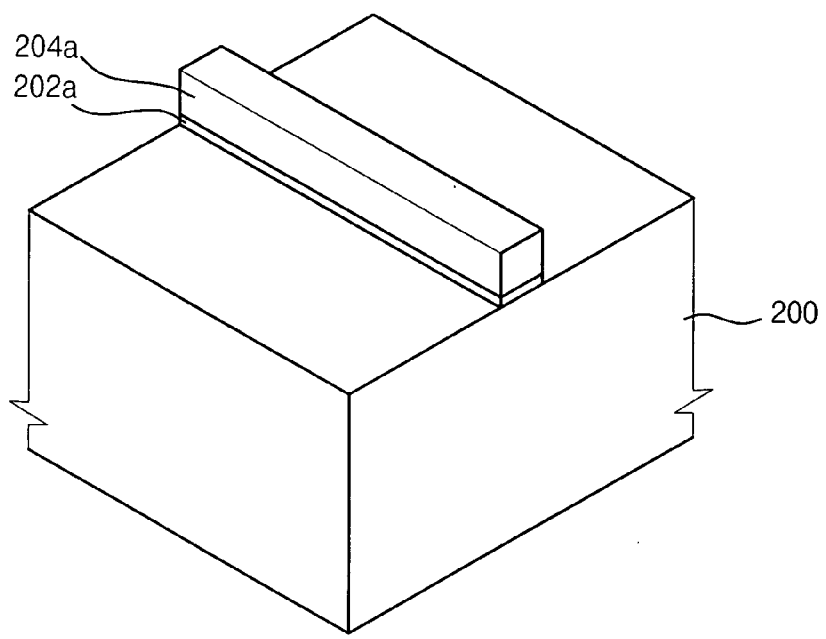

Referring to FIG. 9, a photoresist layer (not shown) is formed on the first silicon nitride layer 204 and is partially removed by a photolithography process, thereby forming a photoresist pattern (not shown) on the first silicon nitride layer 204. The first silicon nitride layer 204 and the first oxide layer 202 are sequentially etched away using the photoresist pattern as an etching mask, thereby forming a first silicon nitride pattern 204a and a first oxide pattern 202a on the substrate 200. Accordingly, the substrate 200 is partially exposed through the first silicon nitride pattern 204a and the first oxide pattern 202a. Thereafter, the photoresist pattern is removed from the second silicon nitride pattern 204a by sequential processes of an ashing process, a stripping process and a cleaning process.

Figure 10:
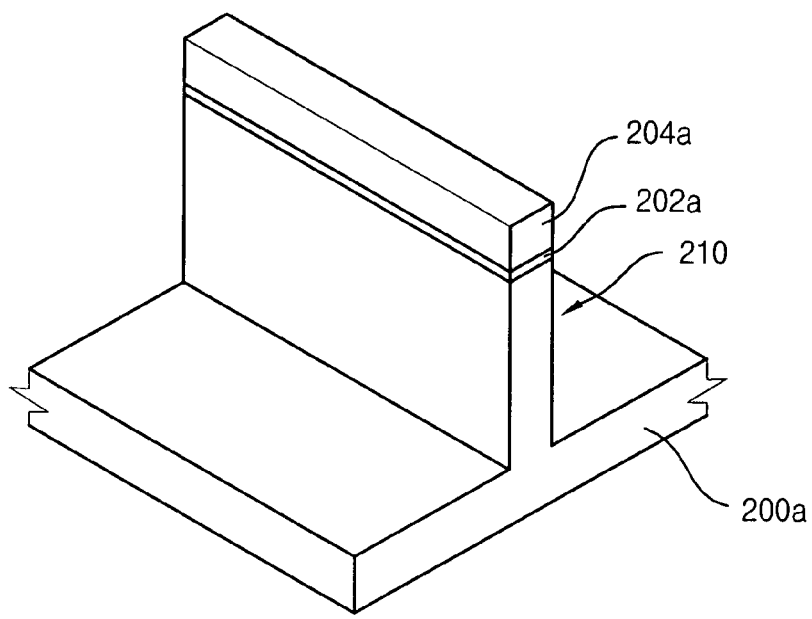

Referring to FIG. 10, the substrate 200 is partially etched away to a predetermined depth using the first silicon nitride pattern 204a as an etching mask, so that a first portion of the substrate 200 exposed through the first silicon nitride pattern 204a is removed while a second portion of the substrate 200 under the first silicon nitride pattern 204a remains unetched. Hereinafter, the etched substrate is designated as a reference numeral 200a for differentiating the etched substrate from the original substrate 200. Accordingly, the second portion of the substrate 200 protrudes from a surface of the etched substrate 200a, thereby forming an active pattern 210 crossing the substrate 200a along the first silicon nitride pattern 204a. The active pattern 210 is commonly referred to as a "fin".

Figure 11:
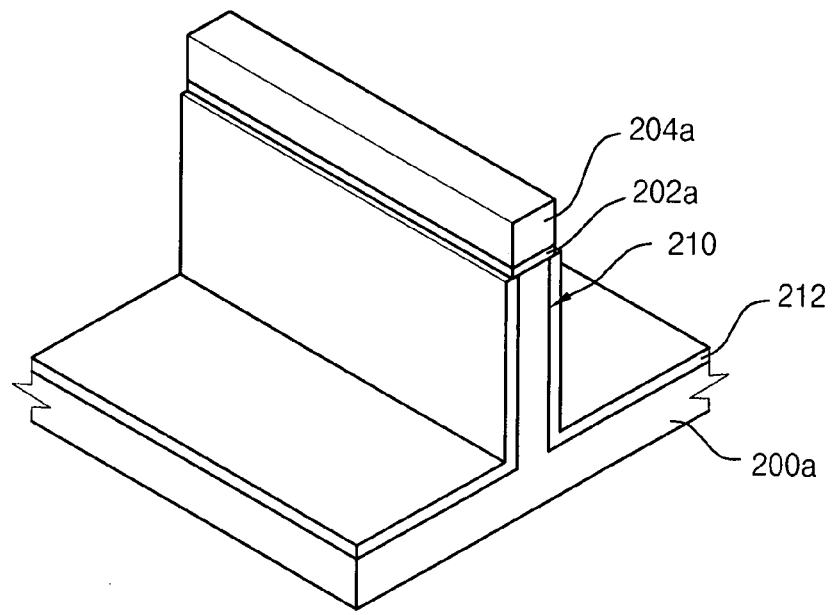

Referring to FIG. 11, a second oxide layer 212 is formed on both sidewalls of the active pattern 210 and on a surface of the etched substrate 200a by a rapid thermal oxidation process, a furnace thermal oxidation process or a plasma oxidation process, so that internal stresses generated in the both sidewalls of the active pattern 210 are released by the second oxide layer 212. Hereinafter, the second oxide pattern 212 is referred to as a sidewall oxide layer.

Figure 12:
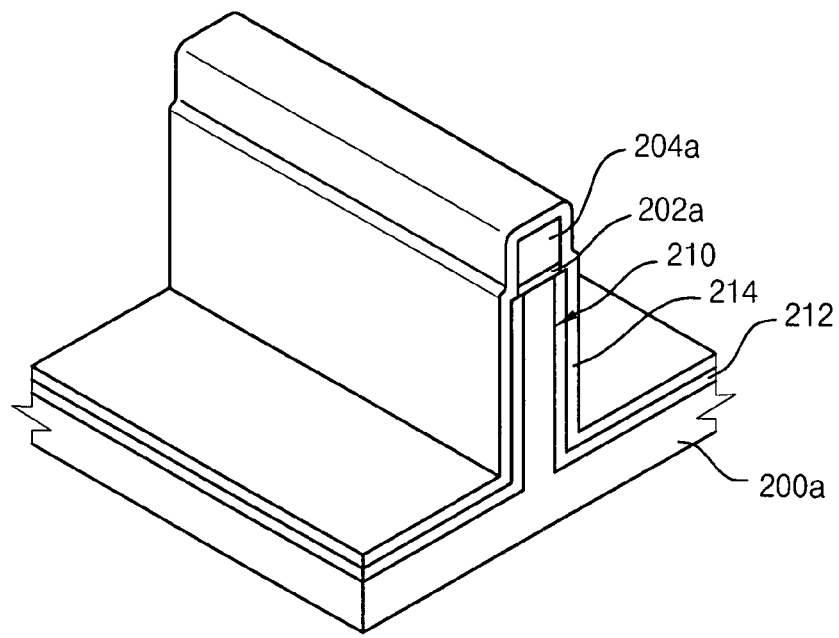

Referring to FIG. 12, a buffer layer 214 is formed on the second oxide layer 212 and the second silicon nitride pattern 204a, and is comprised of a material having an etching selectivity with respect to the second silicon nitride pattern 204a. Accordingly, the first silicon nitride pattern 204a is surrounded by the buffer layer 214 and is protected from being damaged in a subsequent etching process. In the present embodiment, the buffer layer 212 comprises a silicon oxide layer formed by a CVD process, In particular by an LPCVD process, and is formed to a thickness of about 20 Å to about 100 Å.

Figure 13:
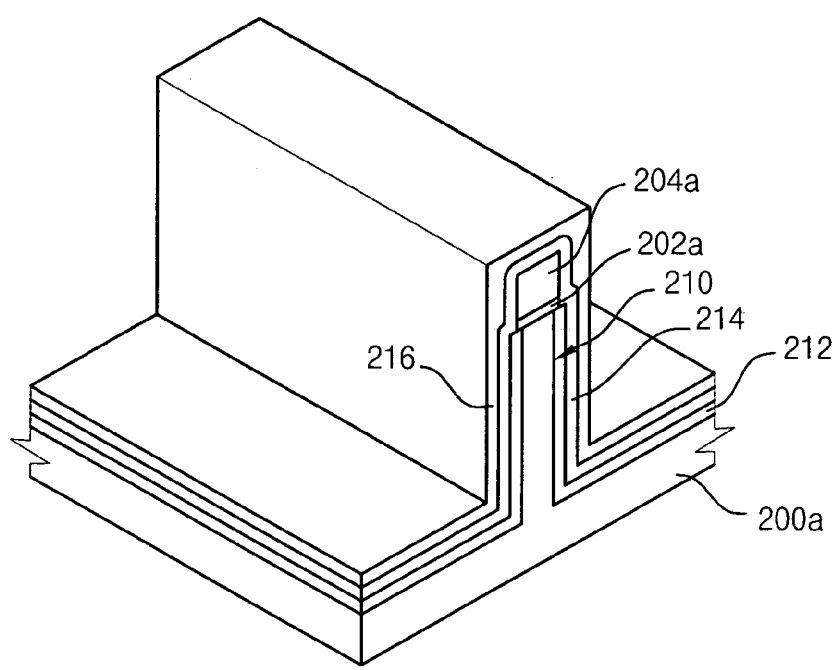

Referring to FIG. 13, a second silicon nitride layer 216 is formed on the buffer layer 214 by a CVD process, in particular by an LPCVD process, to a thickness of about 50 Å to about 200 Å, so that the active pattern 210 is sufficiently prevented from being oxidized by the second silicon nitride layer 216. Hereinafter, the second silicon nitride layer 216 is referred to as a liner.

Figure 14:
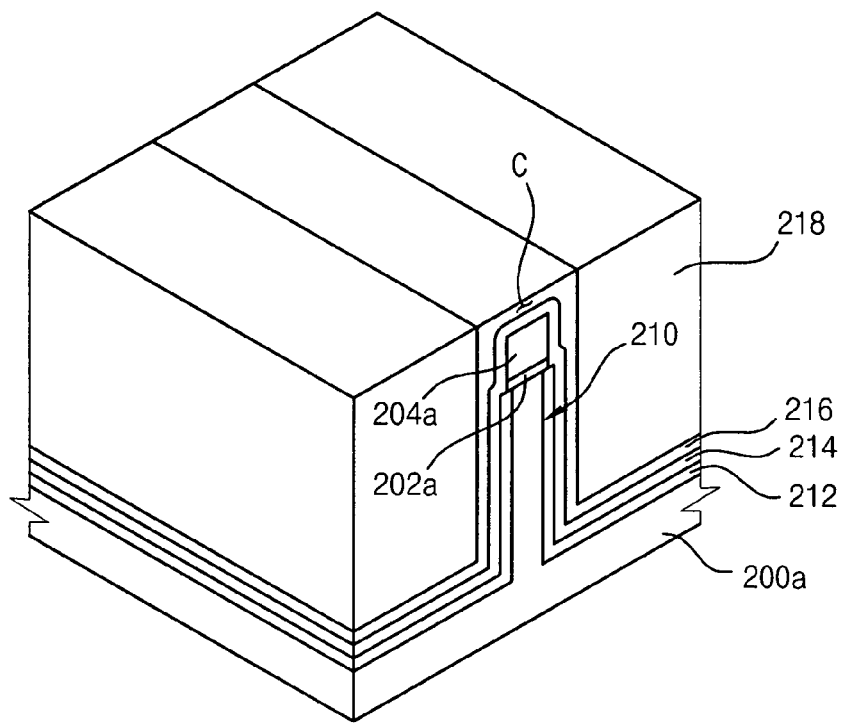

Referring to FIG. 14, an isolation layer (not shown) is formed on the second silicon nitride layer 216 to a sufficient thickness to fill up the etched portion of the etched substrate 200a, so that the active pattern 210 and the first silicon nitride pattern 204a are covered with the isolation layer. Then, the isolation layer is removed by a chemical mechanical polishing (CMP) process until a top surface of the second silicon nitride layer 216 corresponding to a top portion of the active pattern 210 is exposed, so that an isolation pattern 218 is formed on the second silicon nitride layer 216 corresponding to the etched portion of the substrate 200 and a top surface of the isolation pattern is coplanar with a top surface of the second silicon nitride layer 216 corresponding to the top portion of the active pattern 210.

Figure 15:
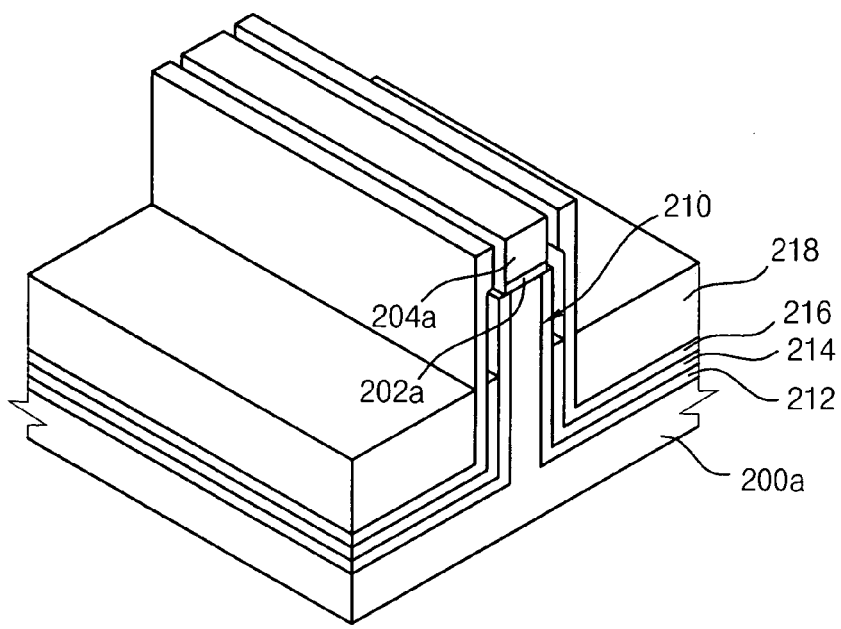

In the present embodiment, the CMP process is performed in such a way that the top surface of the second silicon nitride layer 216 is spaced apart from a top surface of the buffer layer 214 by at least a distance of a clearance gap C. When the isolation layer 218 is removed until a top surface of the buffer layer 214 is exposed, the buffer layer 214 is etched away simultaneously with the isolation pattern 218 when performing an etch back process against the isolation pattern 218 in a subsequent process, and the buffer layer does not protect the first silicon nitride pattern 204a any longer during the etch back process, as shown in FIG. 15. Accordingly, the processing conditions for the CMP process are selected such that the clearance gap C is necessarily obtained between the top surfaces of the second silicon nitride layer 216 and the buffer layer 214.

Figure 16:
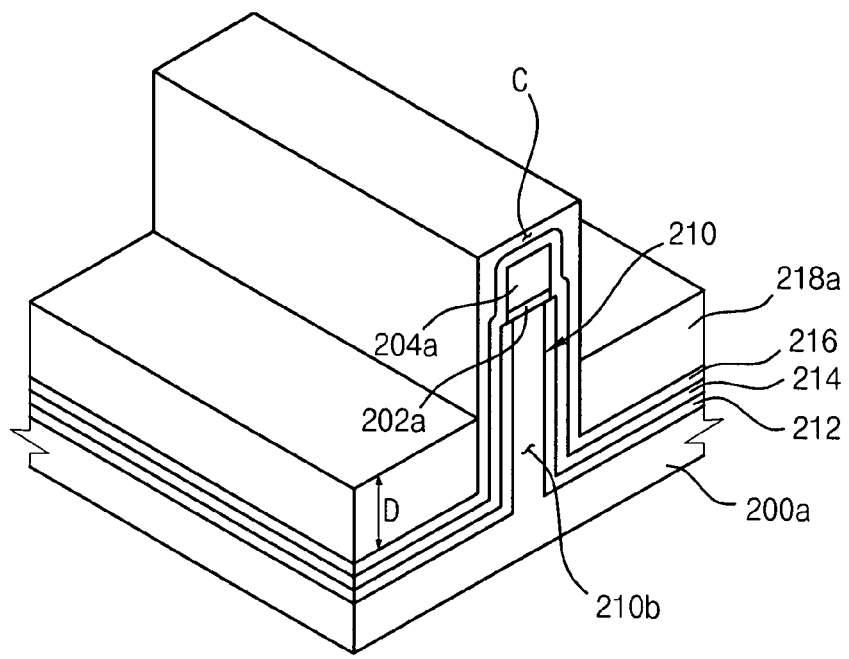

Referring to FIG. 16, the etch back process is performed against the isolation pattern 218 from the top surface thereof to a bottom portion of the active pattern 210, thereby forming a device isolation layer 218a at both side portions of the active pattern. In the present embodiment, the isolation layer 218 is removed to a predetermined depth, so that the device isolation layer 218a has a depth D from the surface of the second silicon nitride layer 216. A second portion 210b of the active pattern 210 is covered with the device isolation layer 218a, and a first portion 210a of the active pattern 210 is not covered with the device isolation layer 218b. Accordingly, the second silicon nitride layer 216 formed on the first portion 210a of the active pattern 210 is exposed by the etch back process against the isolation layer 218, and the second silicon nitride layer 216 formed on the second portion 210b of the active pattern 210 is still covered with the device isolation layer 218a. The depth of the device isolation layer 218a is determined in accordance with the desired channel length of the fin FET 300.

Figure 17:
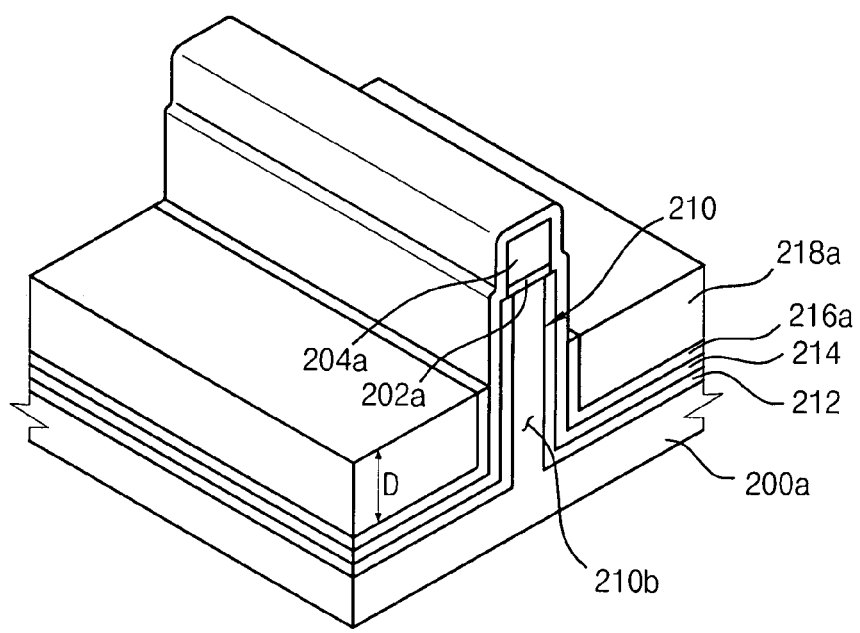

Referring to FIG. 17, the second silicon nitride layer 216 formed on the first portion 210a of the active pattern 210 is removed from the buffer oxide layer 214 by a first etching process in which etching rates of the second silicon nitride layer 216 and the buffer oxide layer 214 are different from each other, thereby forming a second silicon nitride pattern 216a and exposing the buffer layer 214 formed on the first portion 210a of the active pattern 210. In the first etching process, the etching rate of the second silicon nitride layer 216 is greater than that of the buffer oxide layer 214. In the present embodiment, the first etching process includes a wet etching process using a phosphoric acid (H3PO4) solution as an etchant. Accordingly, the first silicon nitride pattern 204a is prevented from being damaged during the etch-back process against the isolation layer 218 because the buffer layer 214 still protects the first silicon nitride pattern 204a during the etch back process.

Figure 18:
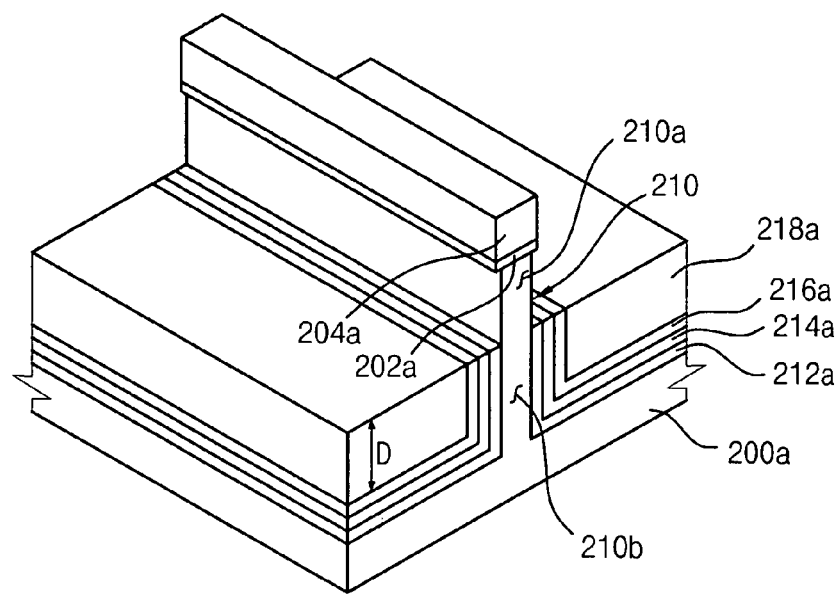

Referring to FIG. 18, the exposed buffer layer 214 and the second oxide layer 212 formed on the first portion 210a of the active pattern 210 are simultaneously removed from the active pattern 210 by a second etching process in which etching rates of the buffer oxide layer 214 and the second oxide layer 212 are different from that of the first silicon nitride pattern 214a, thereby forming a buffer pattern 214a and a second oxide pattern 212a, and exposing sidewalls of the first portion 210a of the active pattern 210. In the second etching process, the etching rates of the buffer layer 214 and the second oxide layer 212 are greater than that of the first silicon nitride pattern 204a. In the present embodiment, the first etching process includes a wet etching process using an aqueous hydrogen fluoride (HF) solution as an etchant. Accordingly, the buffer layer 214 and the second oxide layer 212 are removed from the first silicon nitride pattern 204a without causing any damage to the first silicon nitride pattern 204a. The buffer oxide layer 214 and the second oxide layer 212 may be sequentially removed, as would be known to one of the ordinary skill in the art. Gate, and source and drain electrodes are formed on the substrate 200a including the active pattern 210, thereby forming the fin FET 300 of the first embodiment of the present invention.

According to the present embodiment, the first silicon nitride pattern 204a is prevented from becoming damaged during an etching process that uses phosphoric acid solution by the buffer layer 214, so that an original shape of the first silicon nitride pattern 204a is maintained in an unchanged state, thereby preventing deterioration of electrical characteristics of the resulting fin FET.

The present method of manufacturing the fin FET may also applied to a method of manufacturing a DRAM memory device, an SRAM memory device and a nonvolatile memory device, as would be known to one of the ordinary skill in the art.

Figure 19:
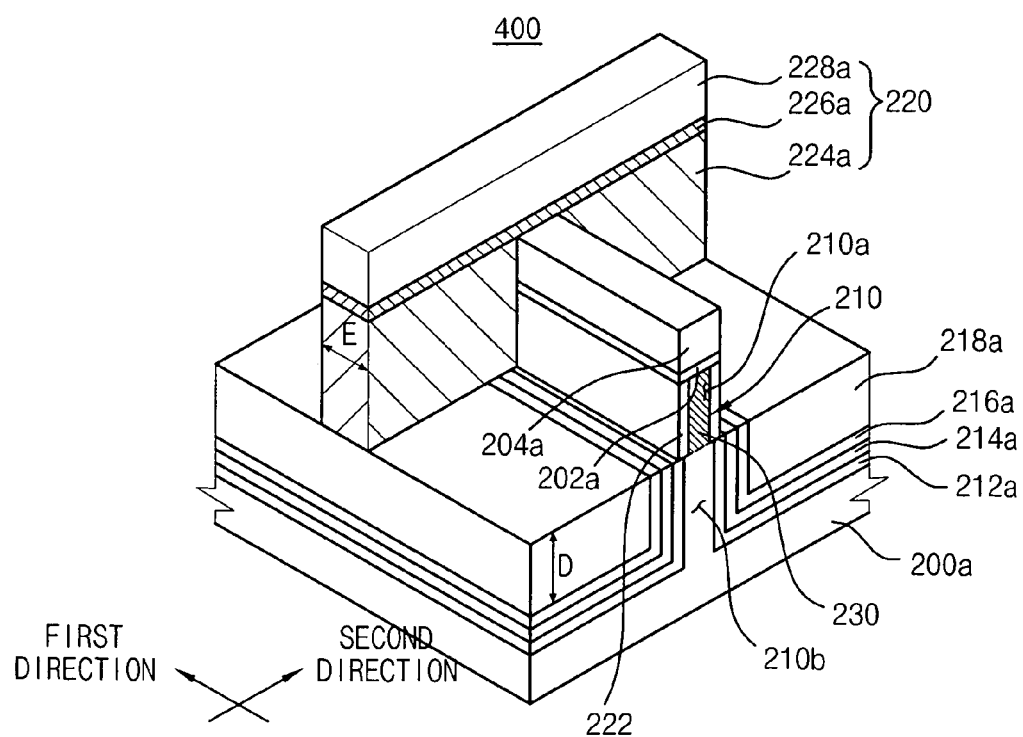
FIG. 19 is a perspective view illustrating a fin FET according to a second embodiment of the present invention.

FIG. 19 is a perspective view illustrating a fin FET according to a second embodiment of the present invention. The fin FET of the present embodiment includes the fin FET shown in the first embodiment of FIG. 7. In the following drawings, the same reference numerals will be used to refer to the same or like parts as those in the above first embodiment, and thus any further detailed descriptions concerning the same elements will be omitted.

Although the fin FET of the present embodiment may be an NPN fin FET or a PNP fin FET, the NPN fin FET is described hereinafter as an example of the fin FET of the present embodiment.

Referring to FIG. 19, the fin FET 400 of the second embodiment of the present invention includes a substrate 200a such as a silicon wafer doped with P type impurities (hereinafter, referred to as P type substrate), an active pattern 210, a first silicon nitride pattern 204a, a second oxide pattern 212a, a buffer pattern 214a, a second silicon nitride pattern 216a and a device isolation layer 218a, a gate electrode 220 and a source/drain region 230 doped with N type impurities. The fin FET 400 may further include a first oxide pattern 202a formed between the active pattern 210 and the first silicon nitride pattern 204a.

The active pattern 210, which is known as a fin, protrudes from P type substrate 200a and extends in a first direction along the P type substrate 200a. The active pattern 210 includes a first portion 210a, which is not covered with the second oxide pattern 212a to be thereby exposed to surroundings and a second portion 210b that is covered with the second oxide pattern 212a. The first portion 210a of the active pattern 210 includes a channel region (not shown) overlapped with the gate electrode 220 and the source/drain region 230 formed at both side portions of the gate electrode 220. A height of the first portion 210a is determined in accordance with a desired length of the channel region.

The first silicon nitride pattern 204a is formed on the active pattern 210. The first silicon nitride pattern 204a operates as an etching mask pattern during an etching process for forming the active pattern 210. Further, the first silicon nitride pattern 204a also operates as a capping layer for preventing generation of a vertical gate field that is concentrated at a spired portion of the active pattern 210 and for preventing the active pattern 210 from being etched away in a subsequent process.

The first oxide pattern 202a, the second oxide pattern 212a, the buffer oxide pattern 214a, the second silicon nitride pattern 216a and the device isolation layer 218a are the same configuration as in the first embodiment described above, and thus any further detailed description about the identical elements will be omitted.

The gate electrode 220 is formed on the device isolation layer 218a in a second direction perpendicular to the first direction, so that the first portion 210a of the active pattern 210 and the first silicon nitride pattern 204a are partially covered with the gate electrode 220. In the present embodiment, the gate electrode 220 includes a gate insulation pattern 210, first and second gate conductive patterns 224a and 226a and a third silicon nitride pattern 228a. The first gate conductive pattern 224a is formed on sidewalls of the first portion 210a of the active pattern 210, and the first gate conductive pattern 224a is formed on sidewalls of the gate insulation layer 222 and the first silicon nitride pattern 204a with a predetermined width E in the second direction. The second gate conductive pattern 226a is formed on the first gate conductive pattern 224a and on the first silicon nitride pattern 204a, and the third silicon nitride pattern 228a is formed on the second gate conductive pattern 226a.

The first gate conductive pattern 224a defines the size of the channel formed on the first portion 210a of the active pattern 210 and is comprised of doped polysilicon, doped polycrystalline silicon germanium, metal or metal silicide. These can be used alone or in a combination thereof.

The third silicon nitride pattern 228a operates as a hard mask layer when forming the gate electrode 220.

N type impurities are implanted at surface portions of the first portion 210a of the active pattern 210 that makes contact with the gate electrode 220, thereby forming the source/drain region 230 at the surface portions of the first portion 210a of the active pattern 210 except for the channel region.

According to the above fin FET 400, damaged sidewalls of the active pattern 210 are sufficiently cured and an original shape of the first silicon nitride pattern 204a is unchanged, so that concentration of the vertical gate field is sufficiently prevented and electrical characteristics of the fin FET 400 are improved. The above fin FET 400 may be applied to a DRAM memory device, an SRAM memory device and a non-volatile memory device, as would be known to one of ordinary skill in the art.

FIGS. 20 to 26 are perspective views illustrating processing steps for a method of manufacturing the fin FET shown in FIG. 19.

The fin FET of the present embodiment includes the fin FET shown in the first embodiment described above. In the following drawings, the same reference numerals will be used to refer to the same or like parts as those in the first embodiment, and thus any further detailed descriptions concerning the same elements will be omitted.

Figure 20:
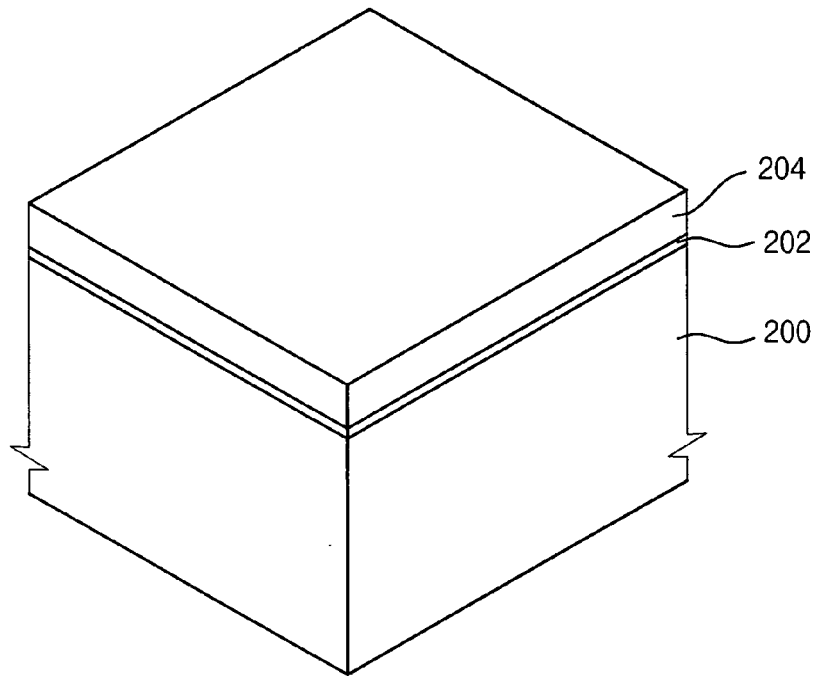
FIGS. 20 to 26 are perspective views illustrating processing steps for a method of manufacturing the fin FET shown in FIG. 19.

Referring to FIG. 20, a first oxide layer 202 is formed on a surface of a silicon substrate 200 doped with P type impurities. A first silicon nitride layer 204 is formed on the first oxide layer 202 as a hard mask layer and a capping layer by a low pressure CVD (LPCVD) process.

Figure 21:
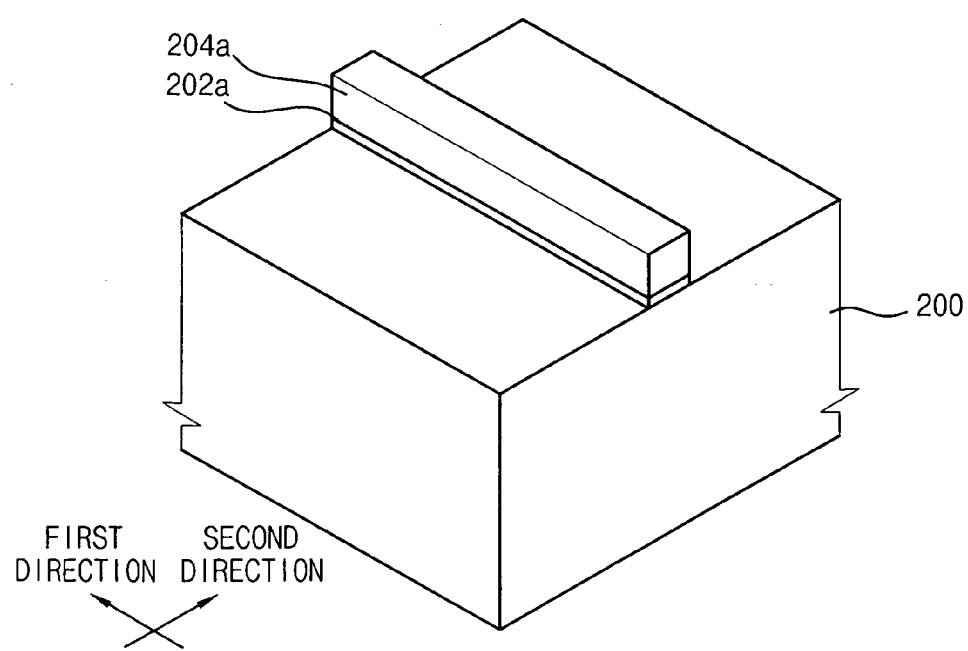

Referring to FIG. 21, a photoresist layer (not shown) is formed on the first silicon nitride layer 204 and is partially removed by a photolithography process, thereby forming a first photoresist pattern (not shown) on the first silicon nitride layer 204. The first silicon nitride layer 204 and the first oxide layer 202 are sequentially etched away using the first photoresist pattern as an etching mask, thereby forming a first silicon nitride pattern 204a and a first oxide pattern 202a on the substrate 200. Accordingly, the substrate 200 is partially exposed through the first silicon nitride pattern 204a and the first oxide pattern 202a. Thereafter, the first photoresist pattern is removed from the second silicon nitride pattern 204a by sequential processes of an ashing process, a stripping process and a cleaning process.

Figure 22:
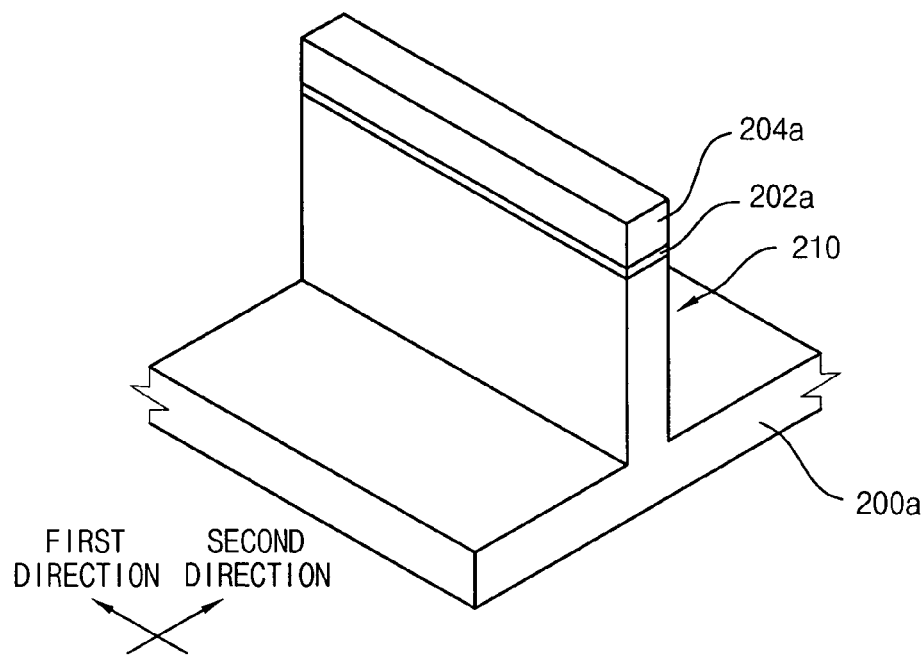

Referring to FIG. 22, the substrate 200 is partially etched away to a predetermined depth using the first silicon nitride pattern 204a as an etching mask, so that a first portion of the substrate 200 exposed through the first silicon nitride pattern 204a is removed while a second portion of the substrate 200 under the first silicon nitride pattern 204a remains unetched. Hereinafter, the etched substrate is designated as a reference numeral 200a for differentiating the etched substrate from the original substrate 200. Accordingly, the second portion of the substrate 200 is protruded from a surface of the etched substrate 200a, thereby forming an active pattern 210 crossing the substrate 200a along the first silicon nitride pattern 204a in a first direction. The active pattern 210 is commonly referred to as a fin.

Figure 23:
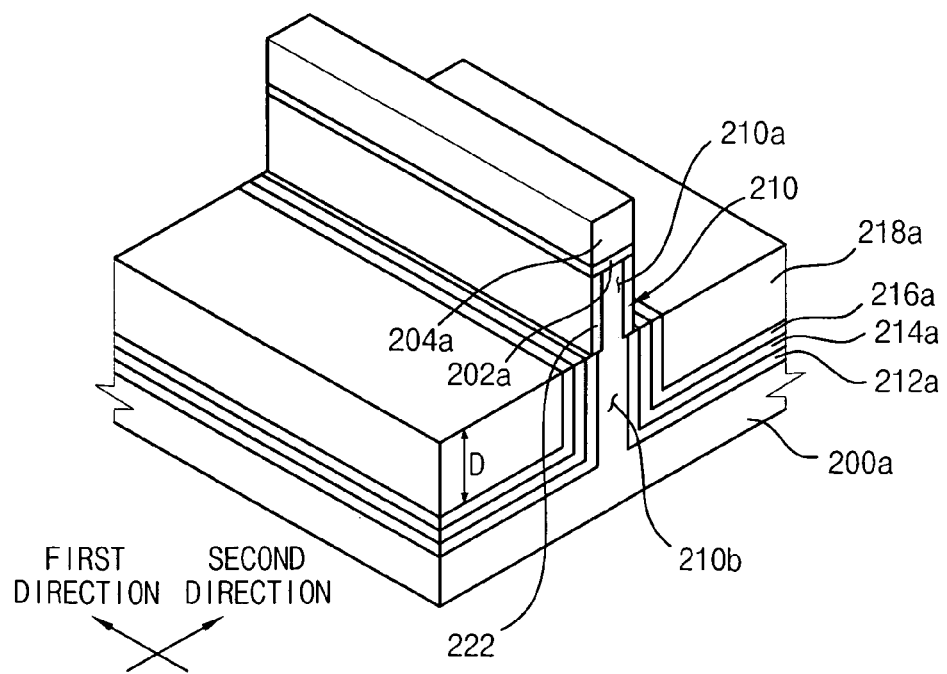

A fin FET structure shown in FIG. 23 is formed in the same process as that described above in connection with the first embodiment with reference to FIGS. 11 to 18, and any detailed description about the same process will be omitted.

Referring to FIG. 23, a gate insulation layer 222 is formed on sidewalls of the first portion 210a of the active pattern 210 by a rapid thermal oxidation process, a furnace thermal oxidation process or a plasma oxidation process. In the present embodiment, the gate insulation layer 222 is formed by a rapid thermal oxidation process, and a plasma nitrification is further performed on the oxidized surface of the active pattern 210. The gate insulation layer 222 is comprised of an insulation material of high dielectric constant such as high-k material.

A channel region is formed on the first portion 210a of the active pattern 210 prior to the gate insulation layer 222 by an ion implantation process. The ion implantation process is performed using the second oxide layer 212 as a mask. The second oxide layer 212 may be removed from the substrate and an additional insulation layer may be formed as an ion implantation mask.

Figure 24:
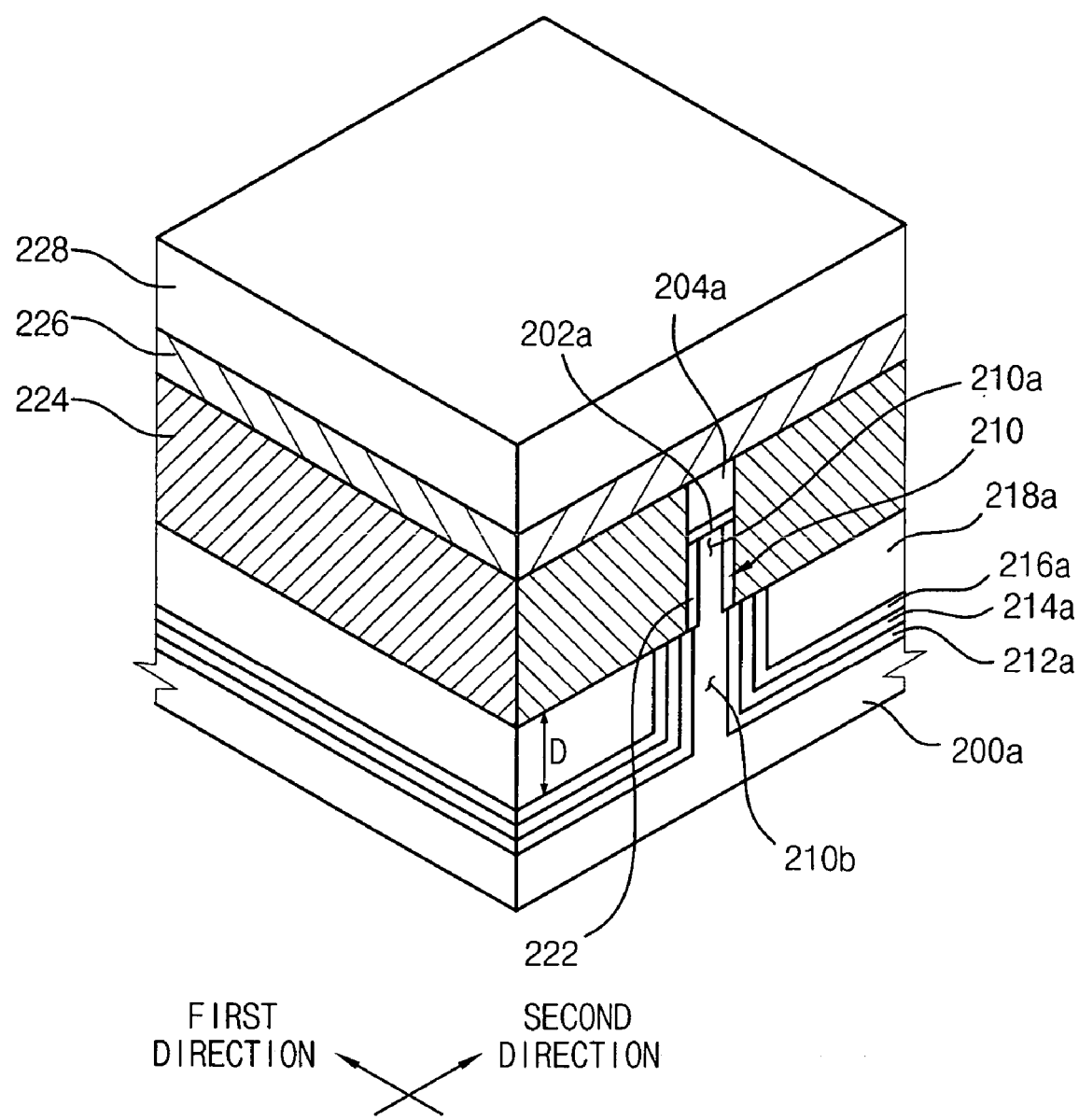

Referring to FIG. 24, a first gate conducive layer is formed on the device isolation layer 218a to a sufficient thickness to cover the gate insulation layer 222 and the first silicon nitride pattern 204a. Then, the first gate conductive layer is removed by a CMP process until a top surface of the second silicon nitride pattern 204a is exposed, thereby forming a first preliminary gate conductive pattern 224. A second conductive layer 226 and a third silicon nitride layer 228 are sequentially formed on the first gate conductive pattern 224.

Figure 25:
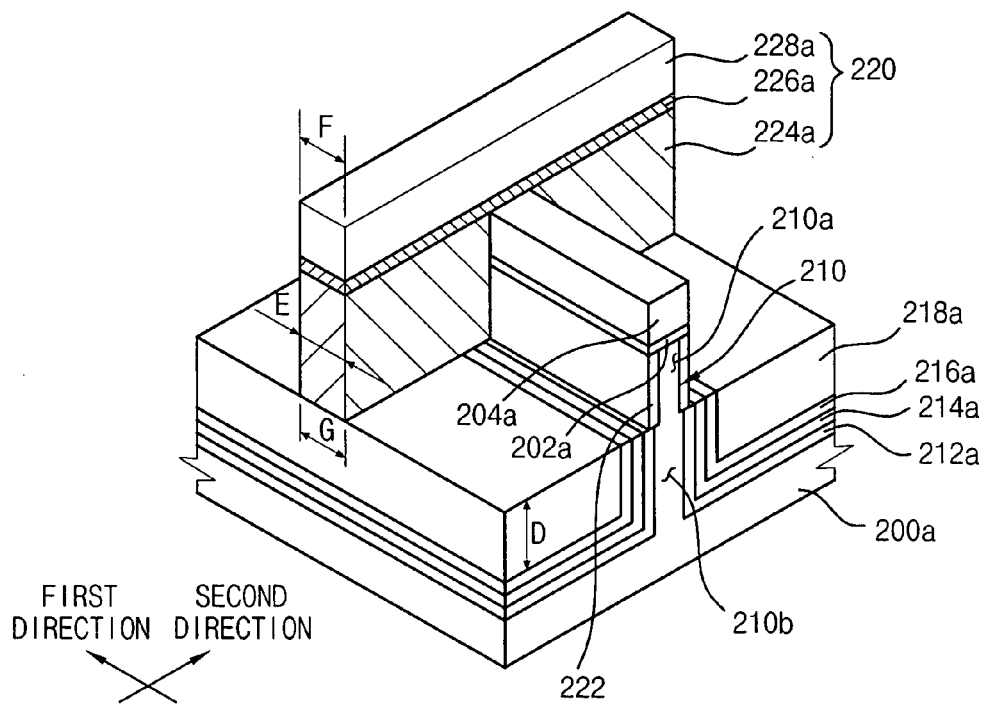

Referring to FIG. 25, a photoresist layer (not shown) is formed on the third silicon nitride layer 228 and is partially removed by a photolithography process, thereby forming a second photoresist pattern (not shown) on the third silicon nitride layer 228. The third silicon nitride layer 228, the second gate conductive layer 226 and the first preliminary gate conductive pattern 224 are sequentially dry-etched away using the second photoresist pattern as an etching mask, thereby forming a third silicon nitride pattern 228a, a second gate conductive pattern 226a and a first gate conductive pattern 224a along a second direction perpendicular to the first direction. Accordingly, the first gate conductive pattern 224a lies adjacent both sidewalls of the first portion 210a of the active pattern 210 over a width E, buffered by gate insulation layer 222, so that a portion of the sidewall of the first portion 210a of the active pattern 210 is covered with the first gate conductive pattern 224a, and a remaining portion of the sidewall of the first portion 210a and corresponding portion of the gate insulation layer is exposed. As a result, the first gate conductive pattern 224a partially making contact with the first portion 210a of the active pattern 210 and the first silicon nitride pattern 204a, is formed on the device isolation layer 218a in the second direction, and the second gate conductive pattern 226a and the third silicon nitride pattern 228a are sequentially formed on the first gate conductive pattern 224a, thereby forming a gate electrode 220 in the second direction.

The dry-etching process for forming the gate electrode 220 is performed in such a manner that an upper width F of the gate electrode 220 is substantially identical to a lower width G of the gate electrode 220. The first portion 210a of the active pattern 210 is prevented from being damaged during the dry etching process by the first silicon nitride pattern 204a. Thereafter, the photoresist pattern is removed from the second silicon nitride pattern 204a by sequential processes of an ashing process, a stripping process and a cleaning process.

Figure 26:
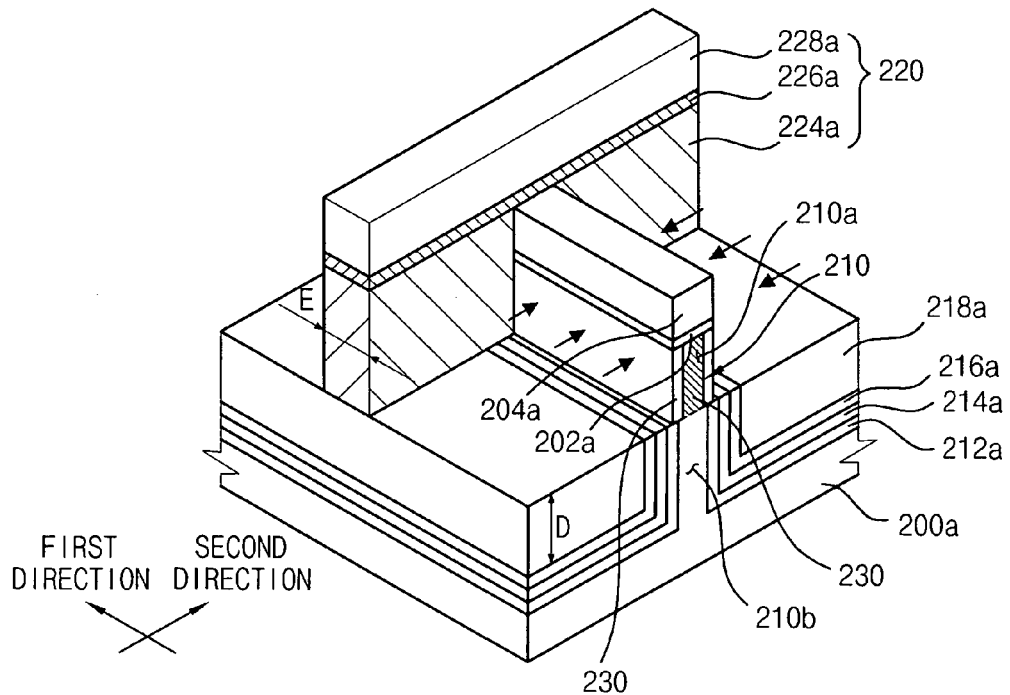

Referring to FIG. 26, N type impurities are implanted onto surface portions of the first portion 210a of the active pattern 210 using the gate electrode 220 as an ion implantation mask, thereby forming a source/drain region 230 at surface portions of the first portion 210a of the active pattern 210. As a result, the NPN type fin FET is completed through the above processing steps.

The above processing steps for the fin FET 400 may be applied to a process for a DRAM memory device, an SRAM memory device and a non-volatile memory device, as would be known to one of the ordinary skill in the art.

According to a fin FET of the present invention, internal stresses applied in sidewalls of the active pattern are sufficiently released and an original shape of the first silicon nitride pattern is maintained in an unchanged state, so that concentration of the vertical gate field is sufficiently prevented and electrical characteristics of the fin FET are improved.

Although the exemplary embodiments of the present invention have been described, it is understood that the present invention should not be limited to these exemplary embodiments but various changes and modifications can be made by one skilled in the art within the spirit and scope of the present invention as hereinafter claimed.

What is claimed is:

1. A method of manufacturing a fin field effect transistor, comprising:

forming a first silicon nitride pattern on a substrate;

forming an active pattern by etching the substrate using the first silicon nitride pattern as an etching mask, so that the active pattern protrudes from the substrate in a vertical direction and extends across the substrate in a horizontal direction;

forming a first oxide pattern on a surface of the substrate and on sidewalls and on a top surface of the active pattern;

forming a buffer layer on the first oxide layer;

forming a second silicon nitride layer on the buffer layer, the second silicon nitride layer having a higher etching rate than the buffer layer;

forming a device isolation layer on the second silicon nitride layer at both side portions of the active pattern, so that a top surface of the device isolation layer is lower than a top portion of the active pattern and so that the second silicon nitride layer is partially exposed;

removing the exposed second silicon nitride layer by a first etching process, so that the buffer oxide layer is partially exposed and a second silicon nitride pattern is formed; and removing the exposed buffer layer and the first oxide layer under the exposed buffer layer by a second etching process, thereby forming a buffer pattern and a first oxide pattern.

2. The method of claim 1, wherein the buffer layer is formed by depositing silicon oxide onto the first oxide layer by a CVD process.

3. The method of claim 1, wherein the first oxide layer is formed by one of a rapid thermal oxidation process, a furnace thermal oxidation process and a plasma oxidation process.

4. The method of claim 1, wherein the first etching process includes a wet etching process using a phosphoric acid (H3PO4) solution as an etchant.

5. The method of claim 1, wherein the second etching process includes a wet etching process using a hydrogen fluoride (HF) solution as an etchant.

6. The method of claim 1, further comprising forming a second oxide pattern on the substrate before forming the first silicon nitride pattern on a substrate.

7. The method of claim 1, wherein forming the device isolation layer includes:

forming an isolation layer on the second silicon nitride layer to a thickness to cover the active pattern and the first silicon nitride pattern;

partially removing the isolation layer until a top surface of the first silicon nitride pattern is exposed, thereby forming an isolation pattern on the second silicon nitride layer;

partially etching the isolation pattern, so that the second silicon nitride layer formed on an upper portion of the active pattern is exposed.

8. A method of manufacturing a fin field effect transistor, comprising:

forming a first silicon nitride pattern on a substrate;

forming an active pattern by etching the substrate using the first silicon nitride pattern as an etching mask, so that the active pattern extends in a first horizontal direction along the substrate;

forming a first oxide pattern on a surface of the substrate and on sidewalls and on a top surface of the active pattern;

forming a buffer layer on the first oxide layer;

forming a second silicon nitride layer on the buffer layer, the second silicon nitride layer having a higher etching rate than the buffer layer;

forming a device isolation layer on the second silicon nitride layer at both side portions of the active pattern, so that a top surface of the device isolation layer is lower than a top portion of the active pattern and so that the second silicon nitride layer is partially exposed;

removing the exposed second silicon nitride layer by a first etching process, so that the buffer oxide layer is partially exposed and a second silicon nitride pattern is formed;

removing the exposed buffer layer and the first oxide layer under the exposed buffer layer by a second etching process, thereby forming a buffer pattern and a first oxide pattern;

forming a gate electrode on the device isolation layer extending in a second horizontal direction perpendicular to the first horizontal direction and having a width in the first horizontal direction, so that the active pattern and the first silicon nitride pattern are partially covered with the gate electrode; and forming a source/drain region on the active pattern adjacent to the gate electrode.

9. The method of claim 8, wherein the buffer layer is formed by depositing silicon oxide onto the first oxide layer by a CVD process.

10. The method of claim 8, wherein the first oxide layer is formed by one of a rapid thermal oxidation process, a furnace thermal oxidation process and a plasma oxidation process.

11. The method of claim 8, wherein the first etching process includes a wet etching process using a phosphoric acid (H3PO4) solution as an etchant.

12. The method of claim 8, wherein the second etching process includes a wet etching process using a hydrogen fluoride (HF) solution as an etchant.

13. The method of claim 8, wherein forming the device isolation layer includes:

forming an isolation layer on the second silicon nitride layer to a thickness to cover the active pattern and the first silicon nitride pattern;

partially removing the isolation layer until a top surface of the first silicon nitride pattern is exposed, thereby forming an isolation pattern on the second silicon nitride layer;

partially etching the isolation pattern, so that the second silicon nitride layer formed on an upper portion of the active pattern is exposed.

* * * * *